US008390097B2

(12) United States Patent
Hamaguchi et al.

(10) Patent No.: US 8,390,097 B2
(45) Date of Patent: Mar. 5, 2013

(54) INSULATED GATE BIPOLAR TRANSISTOR HAVING CONTACT REGION WITH VARIABLE WIDTH

(75) Inventors: Takuya Hamaguchi, Tokyo (JP); Hideki Haruguchi, Tokyo (JP); Tetsujiro Tsunoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 517 days.

(21) Appl. No.: 11/623,932

(22) Filed: Jan. 17, 2007

(65) Prior Publication Data
US 2008/0079066 A1 Apr. 3, 2008

(30) Foreign Application Priority Data
Sep. 29, 2006 (JP) .................. 2006-268764

(51) Int. Cl.
*H01L 27/082* (2006.01)
(52) U.S. Cl. ........ 257/566; 257/565; 257/330; 257/331; 257/E27.076; 257/E29.114
(58) Field of Classification Search .......... 257/330, 257/331, 565, 582, E29.027, 566, E27.076, 257/E29.114
See application file for complete search history.

(56) References Cited

U.S. PATENT DOCUMENTS

| 4,868,631 | A | * | 9/1989 | Hollingsworth et al. ...... 257/517 |
| 5,801,408 | A | * | 9/1998 | Takahashi ...................... 257/212 |
| 6,118,150 | A | * | 9/2000 | Takahashi ...................... 257/341 |
| 6,437,419 | B1 | | 8/2002 | Bhalla et al. |
| 6,717,210 | B2 | * | 4/2004 | Takano et al. ................. 257/330 |
| 6,781,200 | B2 | * | 8/2004 | Ishimura et al. .............. 257/330 |

FOREIGN PATENT DOCUMENTS

| DE | 196 54 113 A1 | 6/1998 |
| DE | 102 39 815 A1 | 8/2003 |
| JP | 10-189971 | 7/1998 |
| JP | 2001-15738 | 1/2001 |

* cited by examiner

*Primary Examiner* — Robert Huber
(74) *Attorney, Agent, or Firm* — Oblon, Spivak, McClelland, Maier & Neustadt, L.L.P.

(57) ABSTRACT

An IGBT comprises trenches arranged in strips, first emitter diffusion layers formed so as to extend in a direction intersecting the trenches, and contact regions formed to have a rectangular shape. The portions of the contact regions on the first emitter diffusion layers have a smaller width than the other portions, the width extending in the direction intersecting the trenches. This configuration allows for an increase in the emitter ballast resistance of the emitter diffusion layers, resulting in enhanced resistance to electrical breakdown due to short circuit.

18 Claims, 34 Drawing Sheets

INSULATED GATE BIPOLAR TRANSISTOR HAVING CONTACT REGION WITH VARIABLE WIDTH

BACKGROUND OF THE INVENTION

1. Field of the Invention

The present invention relates to an insulated gate semiconductor device, and more particularly to an insulated gate semiconductor device adapted to exhibit reduced variation in saturation current and increased resistance to electrical breakdown in a short-circuit capacity test.

2. Background Art

IGBTs (Insulated Gate Bipolar Transistors), which are a type of insulated gate semiconductor device, are widely used in power converters such as inverters, since they combine the high speed operation of MOSFETs and the low turn-on voltage characteristics of bipolar transistors.

In recent years, the turn-on voltage and the switching loss of transistors have been reduced due to development of IGBTs having a trench gate structure. Furthermore, with the appearance of improved IGBTs and IEGTs (Injection Enhanced Gate transistors) having a carrier storage layer, the longitudinal carrier distribution within the chip can be optimized resulting in further reduction of the turn-on voltage and switching loss (see, e.g., Japanese Laid-Open Patent Publication No. 2001-15738).

The above structure allows IGBTs to operate with reduced heat generation and hence improved current density. This results in a reduced chip size, leading to various benefits such as a reduction in the chip cost and in the size of IGBT modules employing such IGBTs (see, e.g., Japanese Laid-Open Patent Publication No. 2001-15738).

Before the IGBTs with a trench gate structure were developed, the minimum chip size was primarily limited by the amount of heat generated by the IGBTs when they were operated. Recently, however, IGBTs have been adapted to operate with less heat generation, and furthermore there have been advances in the technology of cooling a package including IGBTs. Therefore, the chip size has been limited by variation in the threshold voltage $V_{th}$ or in the saturation current, rather than by the generated heat.

There will be described the reason why the chip size is limited by variation in the threshold voltage $V_{th}$ and in the saturation current. If an IGBT is short-circuited and, as a result, a large current flows through it, the control circuit usually detects the short-circuit current and reduces the gate voltage to cut off the current. However, it takes a few microseconds for the control system to cut off the short-circuit current after detecting it, meaning that the chip must be designed so as not to be damaged by the current during this time period.

If the saturation current of an IGBT is too high, the IGBT generates a large amount of heat (equal to the time integral of the product of the saturation current and the collector-emitter voltage of the IGBT) when it is short-circuited, which might result in breakdown of the chip in a short time. Therefore, the IGBT must be designed so as not to generate a higher saturation current than necessary.

If, on the other hand, the saturation current is too small, the control circuit cannot detect when the IGBT is short-circuited and hence does not cut off the short-circuit current. As a result, the short-circuit current continues to flow for a long time, resulting in damage to the chip due to the generated heat. Accordingly, the saturation current value must be within a certain range.

When IGBTs vary in saturation current widely, the MOS portion of an IGBT chip must be designed such that the chip is not damaged even if it includes IGBTs having a high saturation current. Specifically, the chip area must be increased to reduce the saturation current per unit area.

The gate threshold voltage $V_{GE}$ (or $V_{th}$) is a major factor in determining the value of the saturation current. The lower the gate threshold voltage $V_{GE}$ (or $V_{th}$), the higher the saturation current. The saturation current decreases with increasing gate threshold voltage $V_{GE}$. This means that variations in the saturation current can be reduced by reducing variations in the gate threshold voltage $V_{GE}$ (or $V_{th}$).

In the case of an IGBT having a trench gate structure, however, the saturation current varies due to variations in the dimensions of the trench openings or due to lithographic mask misalignment between the trench and emitter forming processes even if the gate threshold voltage $V_{GE}$ (or $V_{th}$) is maintained at a constant level. That is, IGBTs having a trench gate structure exhibit larger variations in saturation current than planer IGBTs even if the variation of their gate threshold voltage $V_{GE}$ (or $V_{th}$) is reduced to a small level. Especially, IGBTs with a trench gate structure including a carrier storage layer have a significant tendency to have such characteristics.

A description will now be made of factors causing variations in the saturation current of IGBTs having a trench structure. FIG. 83 is a plan view of an IGBT having a trench structure as viewed from the principal surface side of the substrate. FIGS. 84 and 85 are cross-sectional views taken along lines I-I and II-II, respectively, of FIG. 83.

Referring to FIG. 83, trenches 4 are arranged in stripes on the principal surface of the substrate. Emitter diffusion layers 9 are also arranged in stripes so as to extend in a direction intersecting the trenches 4. Further, emitter diffusion layers 9a are provided on both sides of each trench 4 such that they parallel the trenches 4 arranged in stripes. Thus, the emitter diffusion layers 9 and 9a together form a lattice-shaped emitter diffusion layer.

As shown in FIGS. 84 and 85, interlayer films 7 are formed so as to cover the top surfaces of the trenches 4. Contact regions 8 are provided between adjacent interlayer films 7. An emitter electrode 6 is formed on the entire top surfaces of a base region 3 and the interlayer films 7. In the cross section shown in FIG. 84, the emitter electrode 6 is electrically connected to the base region 3 through the contact regions 8. In the cross section shown in FIG. 85, on the other hand, the emitter electrode 6 is electrically connected to the emitter diffusion layers 9 through the contact regions 8.

Referring to FIG. 85, when the IGBT is turned on, electrons are supplied from the emitter electrode 6 to the emitter diffusion layers 9 through the contact regions 8. These electrons proceed from the emitter diffusion layers 9 to the emitter diffusion layers 9a connected to the emitter diffusion layers 9 and then to the collector electrode 10 side through the channel regions (not shown) formed along the trenches 5 within the base region 3.

It should be noted that a voltage drop occurs across the emitter diffusion layers 9a. That is, the voltage varies with position along each emitter diffusion layer 9a; it decreases with increasing distance from the connection point between the emitter diffusion layer 9a and the emitter diffusion layer 9 connected thereto. This voltage drop is equal to the product of the emitter diffusion resistance (or emitter ballast resistance) and the electron current. Therefore, the voltage actually applied to the gate is reduced by these emitter diffusion layers 9a, resulting in a reduced saturation current.

In the above configuration, the emitter ballast resistance can be varied by varying the distances between the emitter diffusion layers 9, which are formed in a direction intersecting the trenches 4 arranged in stripes. This means that it is easy to design (or adjust) the saturation current level. Furthermore, the ballast resistance prevents the saturation current from increasing to an unacceptably high level, since the higher the current, the higher the voltage drop across the resistance.

However, in a manufacturing process of the above IGBT, a reduction in the width of the trenches (or trench openings) 4 results in an increase in the width of the emitter diffusion layers 9a formed parallel to the trenches 4. This reduces the emitter ballast resistance and hence increases the saturation current. On the other hand, an increase in the width of the trenches 4 leads to a reduction in the saturation current. That is, the above IGBT is disadvantageous in that a variation in the width of the trenches 4 results in a variation in the width of the emitter diffusion layers 9a formed parallel to the trenches 4 and hence a variation in the saturation current level.

To reduce such a variation in the saturation current, an IGBT having a trench gate structure is proposed which does not include the emitter diffusion layers 9a formed parallel to the trenches 4, as shown in FIGS. 86 to 88. Specifically, FIG. 86 is a plan view of the IGBT having the trench structure as viewed from the principal surface side of the substrate. FIGS. 87 and 88 are cross-sectional views taken along lines I-I and II-II, respectively, of FIG. 86.

In this configuration, the emitter ballast resistance does not vary with variations in the width of the trenches (or trench openings) 4, and therefore the saturation current varies only very slightly. The emitter ballast resistance is substantially negligible. However, a problem with this trench gate structure is that it does not include emitter ballast resistance to prevent the saturation current from increasing to an unacceptably high level. As a result, the IGBT has increased transfer characteristics, which makes it difficult to design its saturation current level.

SUMMARY OF THE INVENTION

The present invention has been devised to solve the above problems. It is, therefore, an object of the present invention to provide an insulated gate semiconductor device, or IGBT, that has appropriately high emitter ballast resistance to achieve transfer characteristics that allow for high resistance to electrical breakdown.

According to one aspect of the present invention, an insulated gate semiconductor device comprises a semiconductor substrate of a first conductive type having a first principal surface and a second principal surface, a base layer of a second conductive type provided adjacent to the first principal surface of the semiconductor substrate, a plurality of trenches formed so as to penetrate through the base layer and into the first principal surface of the semiconductor substrate, the plurality of trenches being arranged in stripes, insulating films covering inner surfaces of the trenches, gate electrodes formed on the insulating films so as to fill the trenches, a plurality of first emitter diffusion layers formed in a surface layer portion of the base layer so as to extend in a direction intersecting the trenches, the plurality of first emitter diffusion layers being arranged in stripes, contact regions provided above the first principal surface of the semiconductor substrate such that the contact regions are located between adjacent ones of the trenches, an emitter electrode formed so as to fill the contact regions, the emitter electrode being electrically connected to the first emitter diffusion layers and the base layer, a collector layer provided on the second principal surface side of the semiconductor substrate, and a collector electrode provided on the second principal surface side of the semiconductor substrate and electrically connected to the collector layer. The contact regions are formed above the first principal surface of the semiconductor substrate so as to extend in the longitudinal direction of the trenches and have a rectangular shape. The portions of the contact regions on the first emitter diffusion layers have a smaller width than the other portions, the width extending in the direction intersecting the trenches.

DETAILED DESCRIPTION OF THE PREFERRED EMBODIMENTS

Preferred embodiments of the present invention will be described with reference to the accompanying drawings. It should be noted that in the following figures, like numerals are used to denote like components to avoid undue repetition.

First Embodiment

Figure 1:
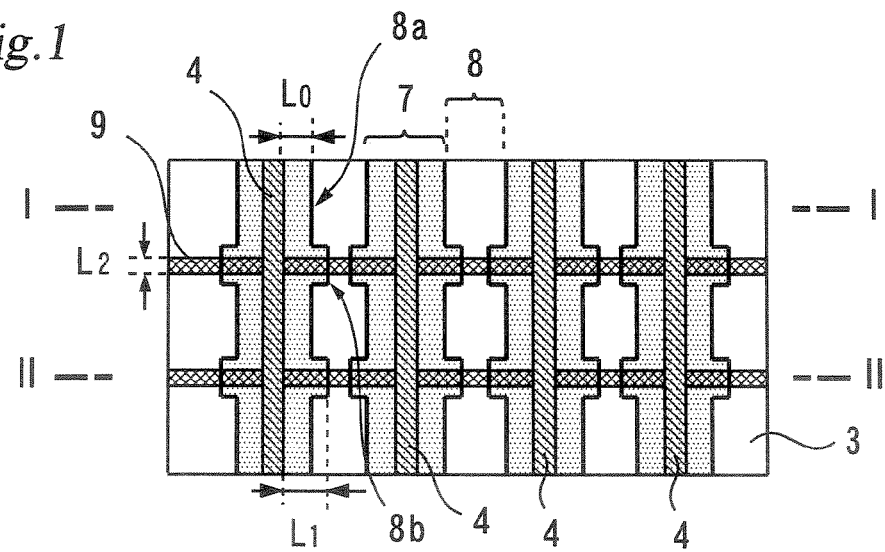
FIGS. 1, 2 and 3 are plan views of an insulated gate semiconductor device according to the first embodiment.
Figure 2:
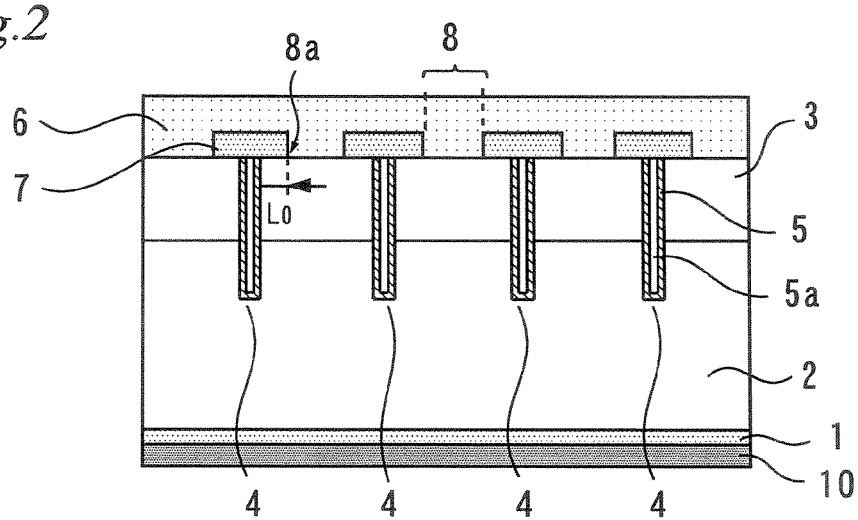
Figure 3:
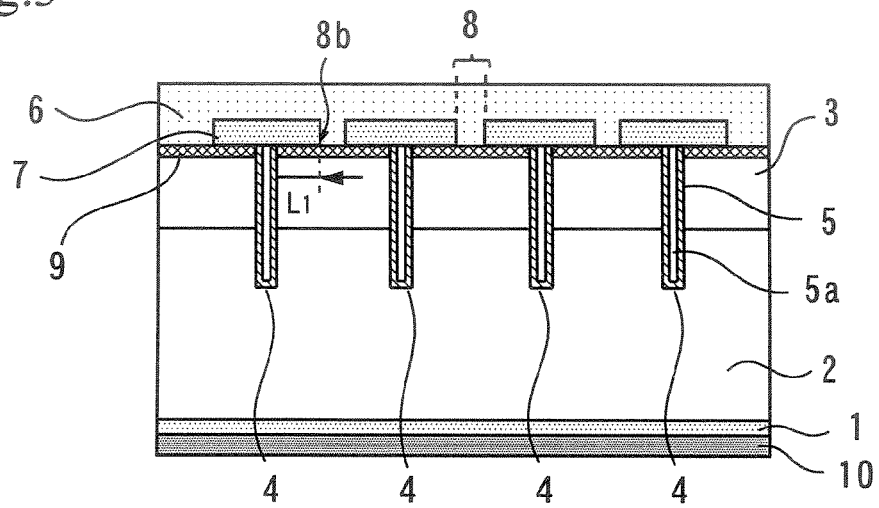

A description will now be made of an insulated gate semiconductor device according to a first embodiment of the present invention. This semiconductor device includes: an insulated gate bipolar transistor(s), or IGBT(s), having a trench gate structure; and an n-type semiconductor substrate having a first principal surface (or top principal surface) and a second principal surface (or back principal surface). FIG. 1 is a plan view of this semiconductor device as viewed from the first principal surface side of the semiconductor substrate. FIGS. 2 and 3 are cross-sectional views taken along lines I-I and II-II, respectively, of FIG. 1.

Referring to FIGS. 2 and 3, a base layer 3 containing a p-type impurity is provided adjacent to the first principal surface of the semiconductor substrate 2. A plurality of trenches 4 are formed so as to penetrate through the base layer 3 and into the first principal surface of the semiconductor substrate 2.

These trenches (or trench openings) 4 are arranged in stripes on the first principal surface side of the semiconductor substrate 2, as shown in FIGS. 1 to 3. First emitter diffusion layers 9 are formed in the surface layer of the base layer 3, as shown in FIG. 3, so as to extend in a direction intersecting the trenches 4 and connect between adjacent trenches 4. The first emitter diffusion layers 9 are also arranged in stripes.

As shown in FIGS. 2 and 3, gate insulating films 5 are formed so as to cover the inner surfaces of the trenches 4. A gate electrode 5a is provided on the gate insulating film 5 in each trench 4. Further, interlayer insulating films 7 are formed so as to cover the top surfaces of the trenches 4.

On the first principal surface side of the semiconductor substrate 2, contact regions 8 are formed between adjacent trenches 4 so as to extend in the longitudinal direction of the trenches 4, as shown in FIG. 1. The base layer 3 is exposed at the contact regions 8, as shown in FIG. 2. An emitter electrode 6 is formed so as to fill the contact regions 8 and is electrically connected to the base layer 3.

Further, as shown in FIG. 3, the first emitter diffusion layers 9 are also exposed at the contact regions 8. As can be seen from FIG. 3, the emitter electrode 6 is also electrically connected to the first emitter diffusion layers 9.

A collector layer 1 is formed on the second principal surface side of the semiconductor substrate 2, as shown in FIGS. 2 and 3. Further, a collector electrode 10 is also formed on the second principal surface side of the semiconductor substrate 2 so as to cover the collector layer 1. The collector electrode 10 is electrically connected to the collector layer 1.

It should be noted that the contact regions 8 have a rectangular shape and extend over the first principal surface of the semiconductor substrate 2 in the longitudinal direction of the trenches 4. Referring to FIG. 1, note the leftmost trench 4 and the contact region 8 adjacent to the right side of this trench 4. Further note the cross-sectional view of FIG. 2 taken along line I-I of FIG. 1 showing a portion of the semiconductor device that does not include the emitter diffusion layers 9 exposed at the contact regions 8. In this portion, the distance between the leftmost trench 4 and a lower left edge 8a of an adjacent contact region 8 is $L_0$ as indicated in FIG. 2. Then note the cross-sectional view of FIG. 3 taken along line II-II of FIG. 1 showing a portion of the semiconductor device that includes the emitter diffusion layers 9 exposed at the contact regions 8. In this portion, the distance between the leftmost trench 4 and a lower left edge 8b of the adjacent contact region 8 is $L_1$ as indicated in FIG. 3, where $L_1 > L_0$. That is, the portions of the contact regions 8 on the first emitter diffusion layers 9 have a smaller width than the other portions, the width extending in a direction intersecting the trenches 4.

In the configuration shown in FIG. 1, the emitter diffusion layers are formed so as to extend in a direction intersecting the longitudinal direction of the trenches 4. Therefore, this configuration can reduce variations in the saturation current due to variations in the dimensions of the trench openings or due to lithographic mask misalignment between the trench and emitter forming processes.

The IGBT is turned on by applying a voltage higher than the threshold voltage to its gate. In this state, electrons flow from the emitter electrode to the collector electrode through the emitter diffusion layers and channel regions. When these electrons pass through the emitter diffusion layers, the emitter diffusion resistance provides resistance to the passage, resulting in a reduced current. That is, increasing the emitter ballast resistance reduces the current flowing through the IGBT and hence enhances the resistance to electrical breakdown even when the IGBT is short-circuited, in which case the current is large.

Figure 86:
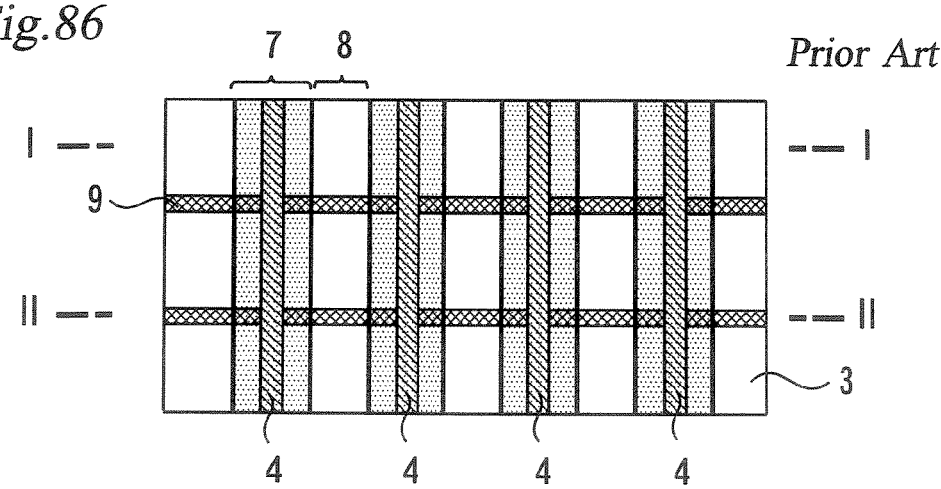
FIG. 86 is a plan view of a conventional insulated gate semiconductor device.
Figure 87:
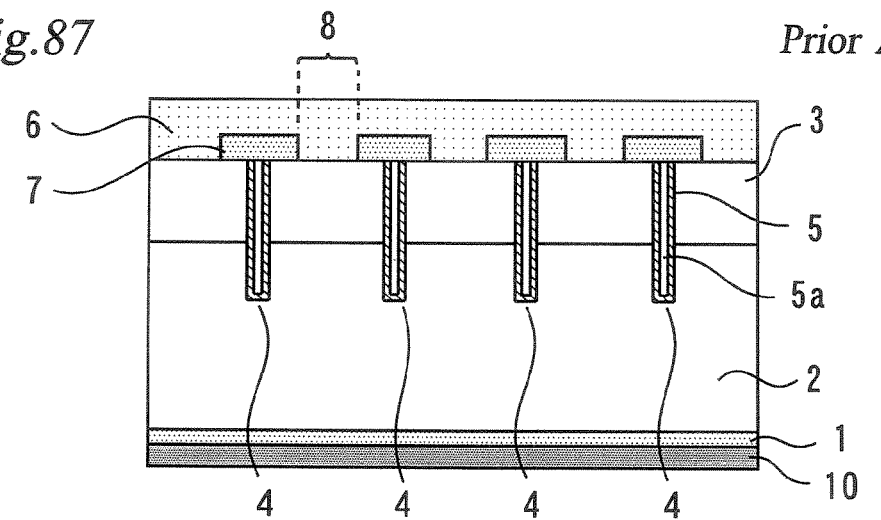
FIGS. 87 and 88 are cross-sectional views of a conventional insulated gate semiconductor device.
Figure 88:
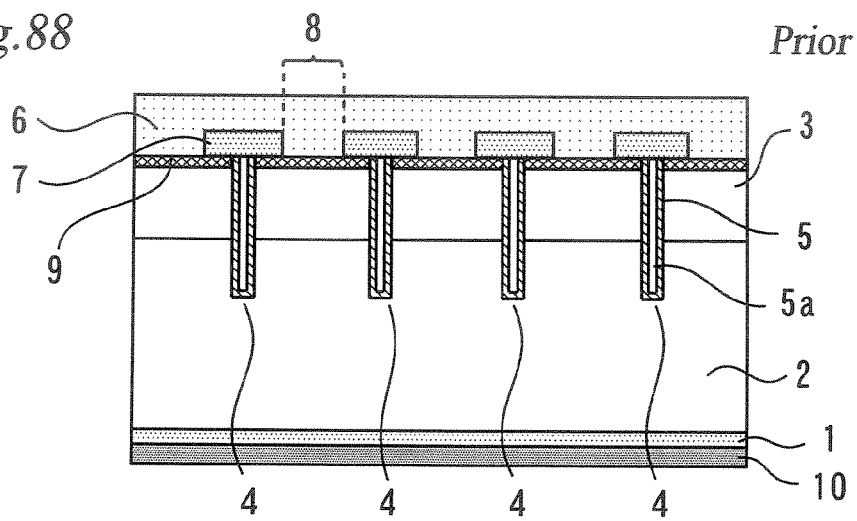

In the configuration shown in FIG. 1, the contact regions 8 do not have an exact rectangular shape, as viewed from the first principal surface side of the semiconductor substrate 2, but has such a shape that the areas of the emitter electrode 6 in contact with the base layer 3 are increased while the areas of the emitter electrode 6 in contact with the emitter diffusion layers 9 are reduced. This configuration provides higher emitter ballast resistance than the configuration shown in FIGS. 86 to 88.

This reduces the transfer characteristics of the IGBT, thereby preventing a large current from flowing through the IGBT when it is short-circuited. Thus, the IGBT has enhanced resistance to electrical breakdown even though its emitter diffusion layers are arranged in stripes.

In FIG. 3, the distance between the leftmost trench 4 and a lower left edge 8b of an adjacent contact region 8 is denoted by $L_1$, as described above. Further, in FIG. 1, the width of the first emitter diffusion layers 9 in the longitudinal direction of the trenches 4 is denoted by $L_2$. Preferably, the ratio of $L_1$ to $L_2$ is 0.5 or more (that is, $L_1 = 0.5 \times L_2$) and the sheet resistance of the first emitter diffusion layers 9 is 100 Ω/□ or more.

The emitter ballast resistance in the configuration shown in FIGS. 1 to 3 can be optimized by satisfying the above requirements, which results in further enhancement of resistance to electrical breakdown.

As described above, the present embodiment provides an insulated gate semiconductor device, or IGBT, that has appropriately high emitter ballast resistance to achieve transfer characteristics that allow for high resistance to electrical breakdown.

Figure 4:
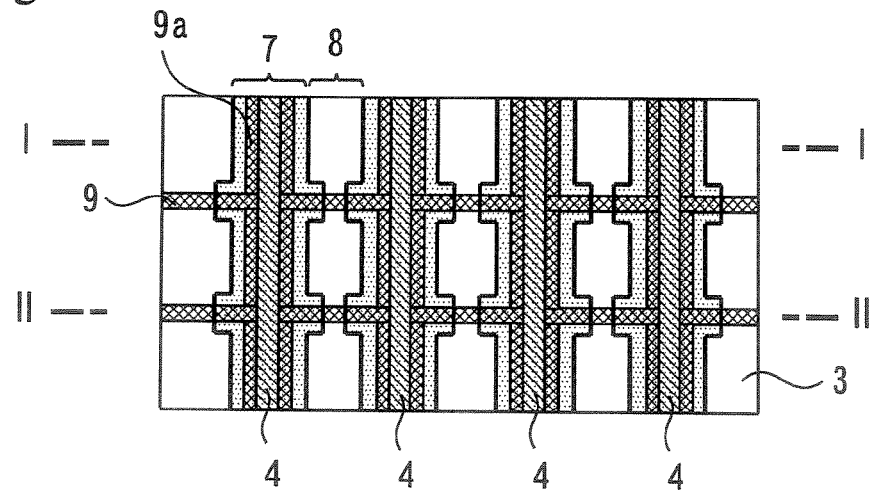
FIG. 4 is a plan view of an insulated gate semiconductor device according to a variation in the first embodiment.
Figure 5:
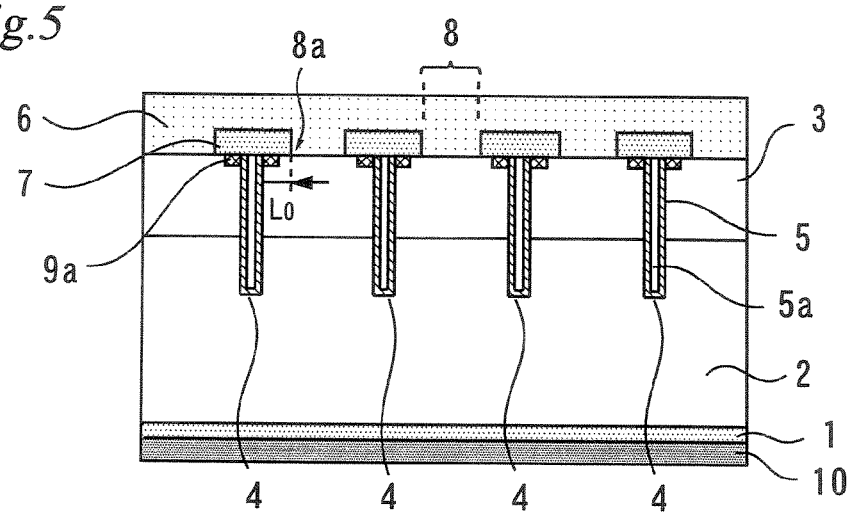
FIGS. 5 and 6 are cross-sectional views of an insulated gate semiconductor device according to a variation in the first embodiment.
Figure 6:
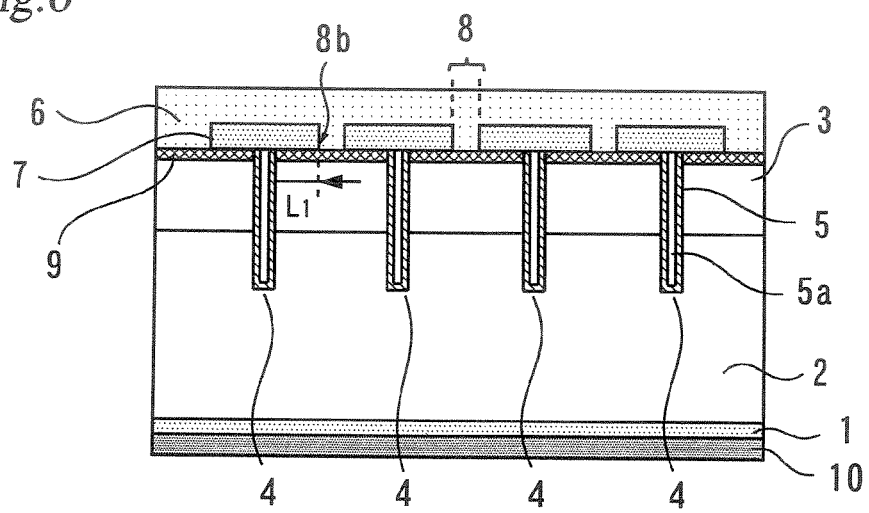

A variation of the present embodiment will be described with reference to FIGS. 4 to 6. FIG. 4 is a plan view of an insulated gate semiconductor device according to this variation. FIGS. 5 and 6 are cross-sectional views taken along lines I-I and II-II, respectively, of FIG. 4.

Referring to FIG. 4, a plurality of trenches 4 are arranged in stripes, and a plurality of first emitter diffusion layers 9 are also arranged in stripes so as to extend in a direction intersecting the trenches 4. Further, second emitter diffusion layers 9a having a strip shape are formed in contact with respective sides of each trench 4 so as to connect between adjacent first emitter diffusion layers 9. Thus, the pluralities of first emitter diffusion layers 9 and second emitter diffusion layers 9a together form a lattice-shaped emitter diffusion layer. All other components and structures are similar to those shown in FIGS. 1 to 3.

Figure 83:
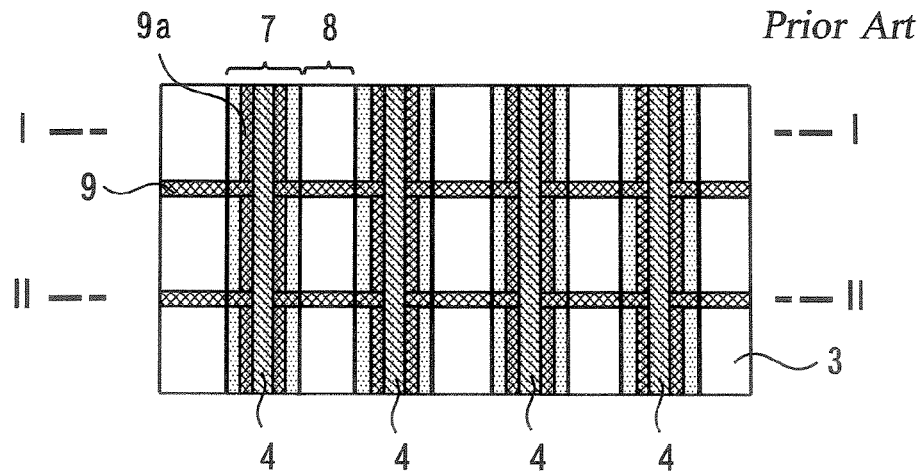
FIG. 83 is a plan view of a conventional insulated gate semiconductor device.
Figure 84:
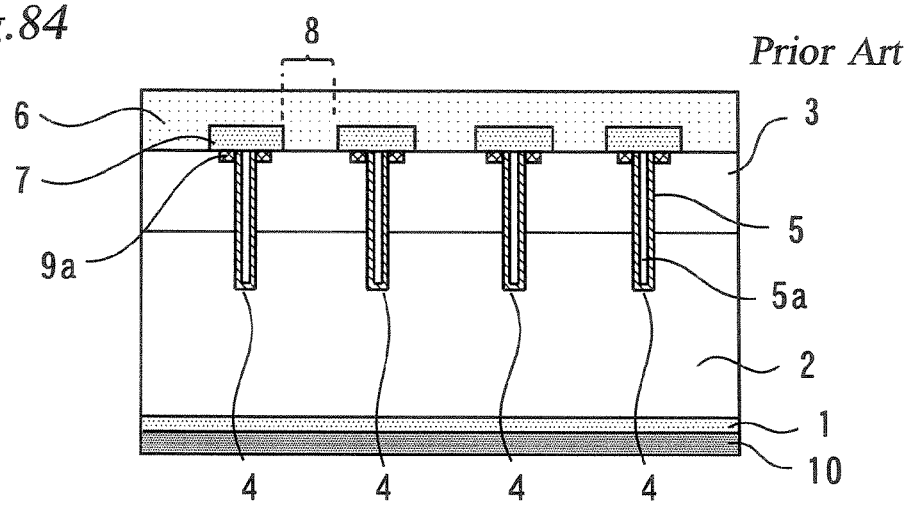
FIGS. 84 and 85 are cross-sectional views of a conventional insulated gate semiconductor device.
Figure 85:
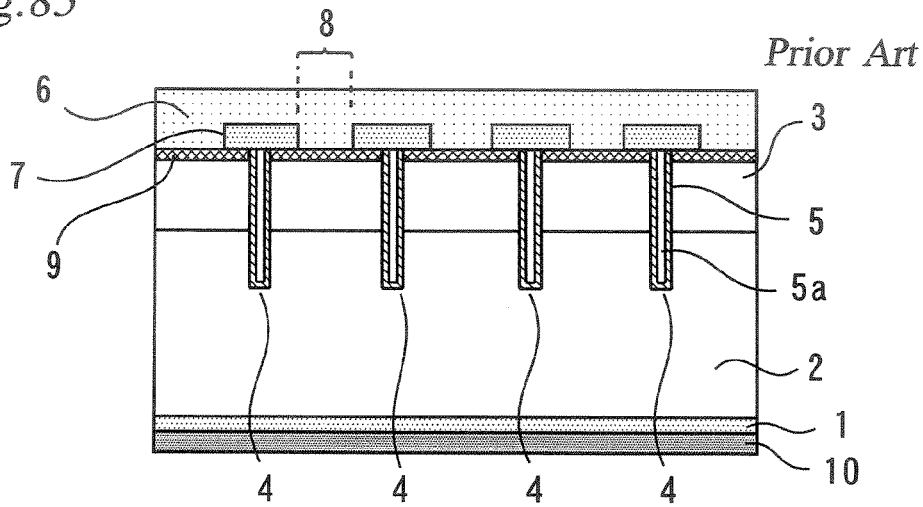

The above configuration also provides high emitter ballast resistance, as compared to the configuration shown in FIGS. 83 and 85. Therefore, this variation provides an insulated gate semiconductor device, or IGBT, that has appropriately high emitter ballast resistance to achieve transfer characteristics that allow for high resistance to electrical breakdown.

Second Embodiment

Figure 7:
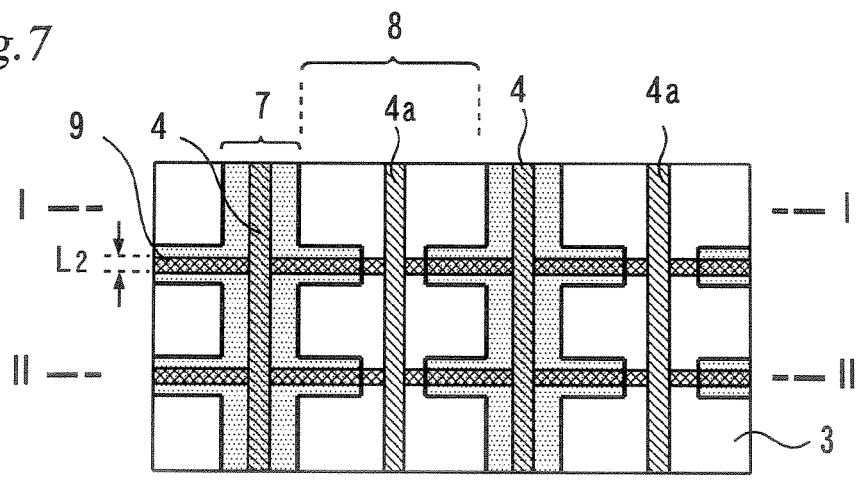
FIG. 7 is a plan view of an insulated gate semiconductor device according to the second embodiment.
Figure 8:
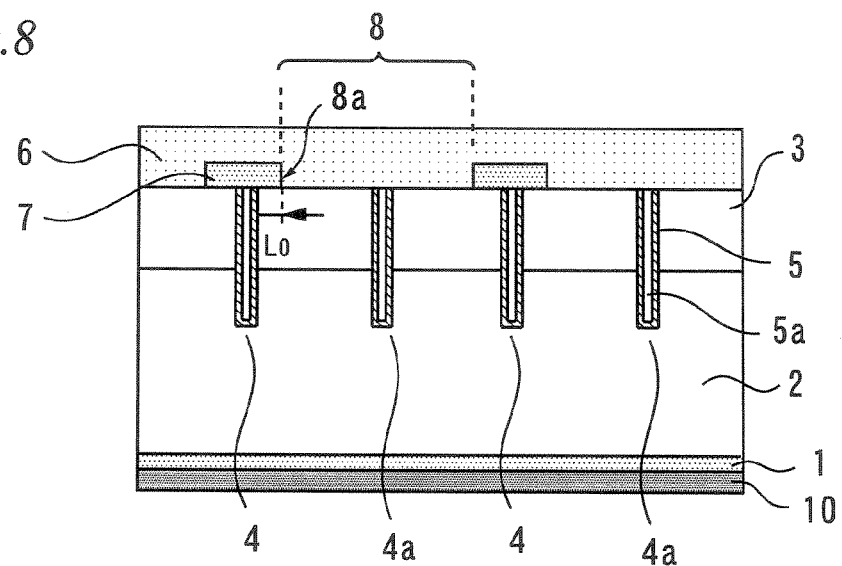
FIGS. 8 and 9 are cross-sectional views of an insulated gate semiconductor device according to the second embodiment.
Figure 9:
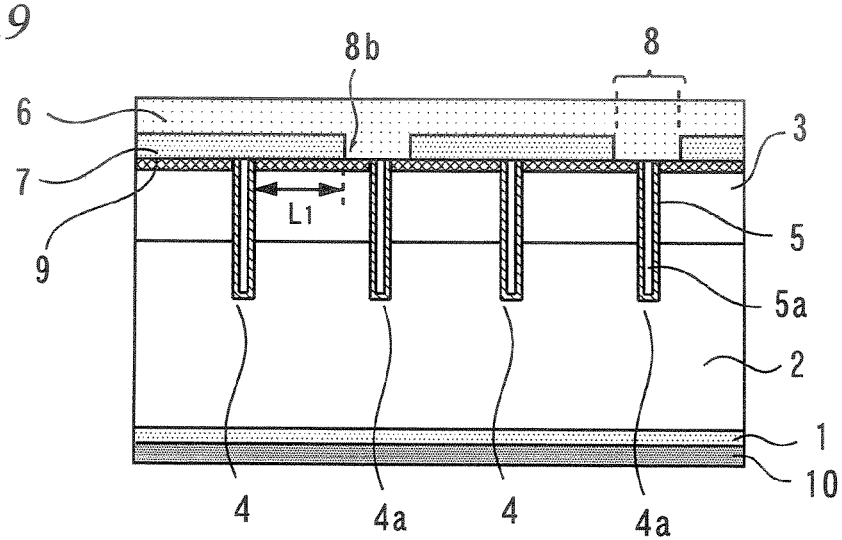

A description will now be made of an insulated gate semiconductor device according to a second embodiment of the present invention with reference to FIGS. 7 to 9. The following description will focus on the differences from the first embodiment. FIG. 7 is a plan view of the insulated gate semiconductor device according to this embodiment. FIGS. 8 and 9 are cross-sectional views taken along lines I-I and II-II respectively, of FIG. 7.

Referring to FIG. 7, a plurality of trenches 4 are arranged in stripes, and a dummy trench 4a is provided between each two adjacent trenches 4 so as to extend in the longitudinal direction of the trenches 4. Thus, these dummy trenches 4a are arranged in stripes and extend in the longitudinal direction of the trenches 4. Further, first emitter diffusion layers 9 are formed so as to extend in a direction intersecting the trenches 4 and connect between the trenches 4 and the dummy trenches 4a. More specifically, the dummy trenches 4a are formed right under the contact regions 8 and connected to the emitter electrode 6, as shown in FIGS. 8 and 9. All other components and structures are similar to those described in connection with the first embodiment.

The above configuration provides an increase in the length of the portions of the emitter diffusion layers 9 defined between each trench 4 and each contact region 8 adjacent thereto (that is, the distance, denoted by $L_1$ in FIG. 9, between each trench 4 and a lower left edge or lower right edge 8b of each contact region 8 adjacent to the trench), as compared to the configuration shown in FIG. 1. This allows for a further increase in the emitter ballast resistance, as compared to the first embodiment. Therefore, it is possible to reduce the turn-on voltage of the IGBT in a normal operation in which a large current does not flow through the IGBT while preventing the current from increasing to an unacceptably high level when the IGBT is short-circuited. That is, the present embodiment can more effectively enhance resistance to electrical breakdown than the first embodiment.

As described above, the present embodiment can more effectively increase resistance to electrical breakdown than the first embodiment.

Figure 10:
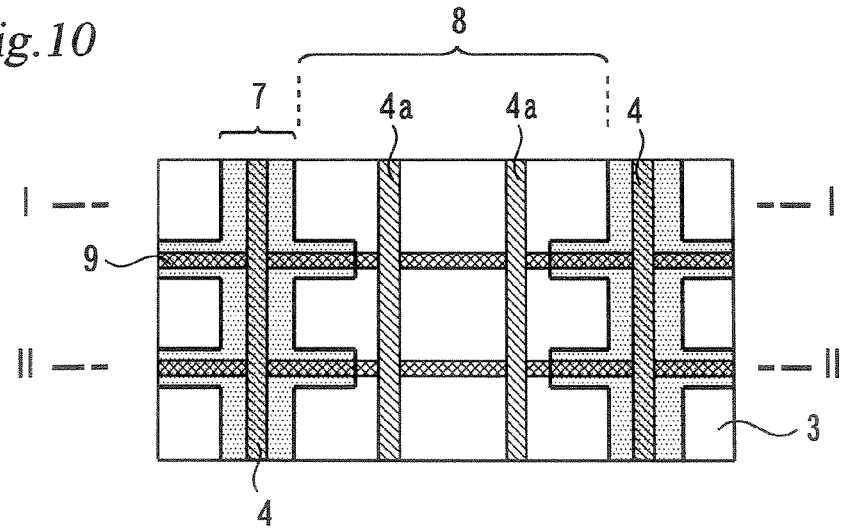
FIG. 10 is a plan view of an insulated gate semiconductor device according to the first variation in the second embodiment.
Figure 11:
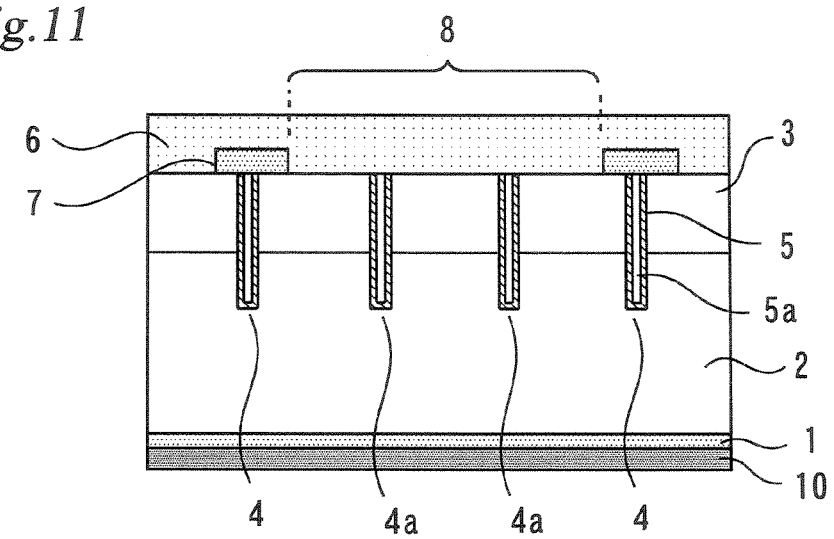
FIGS. 11 and 12 are cross-sectional views of an insulated gate semiconductor device according to the first variation in the second embodiment.
Figure 12:
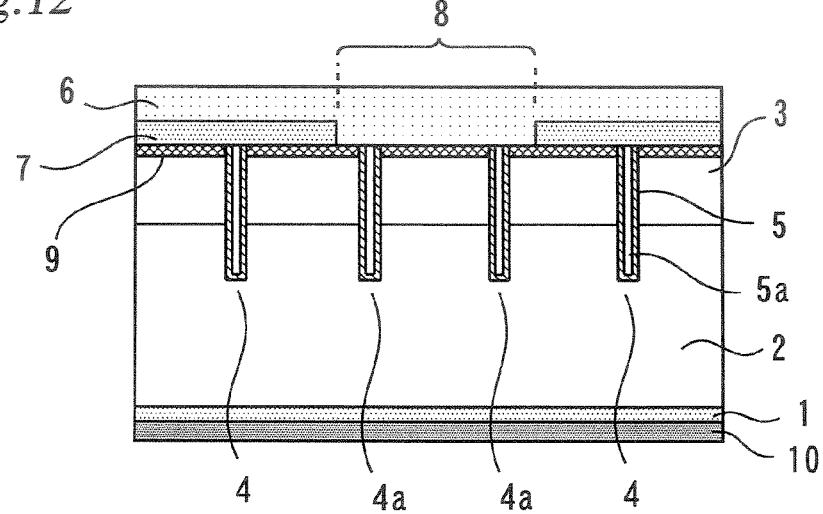

A first variation of the second embodiment will be described with reference to FIGS. 10 to 12. FIG. 10 is a plan view of an insulated gate semiconductor device according to this variation. FIGS. 11 and 12 are cross-sectional views taken along lines I-I and II-II, respectively, of FIG. 10.

Referring to FIG. 10, a plurality of trenches 4 are arranged in stripes, and a plurality of first emitter diffusion layers 9 are also arranged in stripes so as to extend in a direction intersecting the trenches 4. According to this variation, two dummy trenches 4a are provided between each two adjacent trenches 4.

Although the configuration shown in FIGS. 10 to 12 includes two dummy trenches 4a between each two adjacent trenches 4, three or more dummy trenches 4a may be provided between these adjacent trenches 4. That is, any plurality of dummy trenches 4a may be arranged in stripes between each two adjacent trenches 4. Such a configuration can produce the same effect as the configuration shown in FIGS. 7 to 9.

Figure 13:
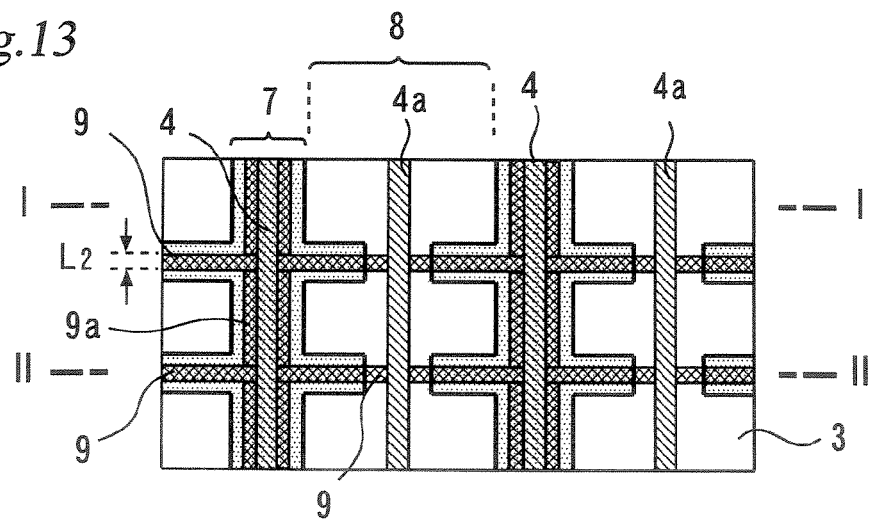
FIG. 13 is a plan view of an insulated gate semiconductor device according to the second variation in the second embodiment.
Figure 14:
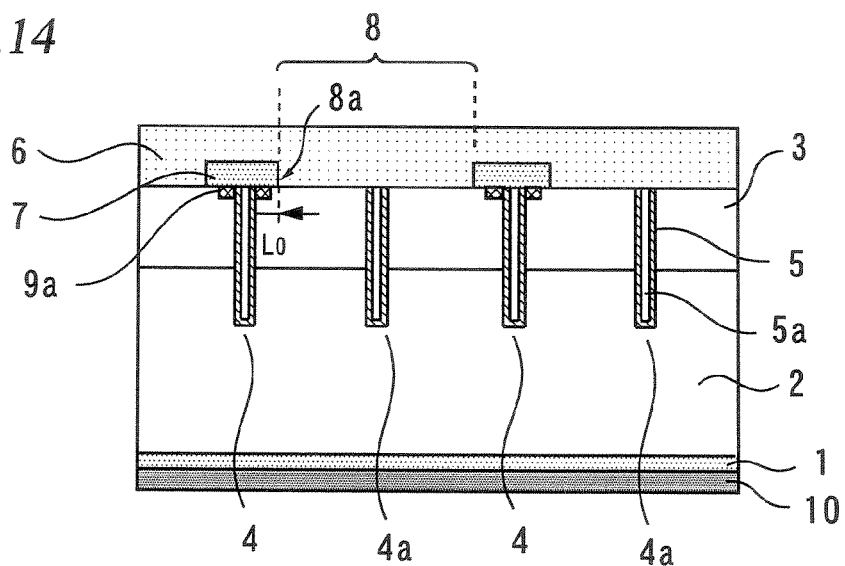
FIGS. 14 and 15 are cross-sectional views of an insulated gate semiconductor device according to the second variation in the second embodiment.
Figure 15:
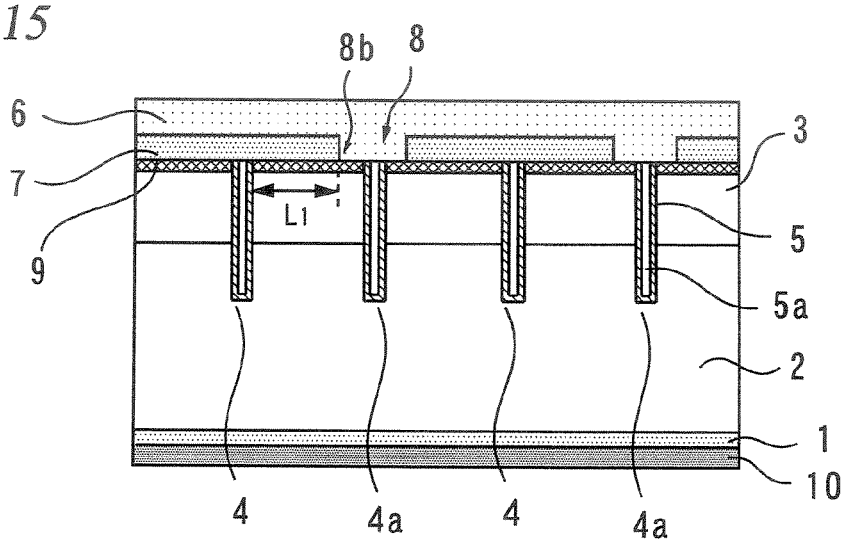

A second variation of the second embodiment will now be described with reference to FIGS. 13 to 15. FIG. 13 is a plan view of an insulated gate semiconductor device according to this variation. FIGS. 14 and 15 are cross-sectional views taken along lines I-I and II-II, respectively, of FIG. 13.

Referring to FIG. 13, a plurality of second emitter diffusion layers 9a having a strip shape are formed in contact with respective sides of each trench 4 so as to connect between adjacent first emitter diffusion layers 9. Thus, the pluralities of first emitter diffusion layers 9 and second emitter diffusion layers 9a together form a lattice-shaped emitter diffusion layer. All other components and structures are similar to those shown in FIGS. 7 to 9. This configuration also can produce the same effect as the configuration shown in FIGS. 7 to 9.

Figure 16:
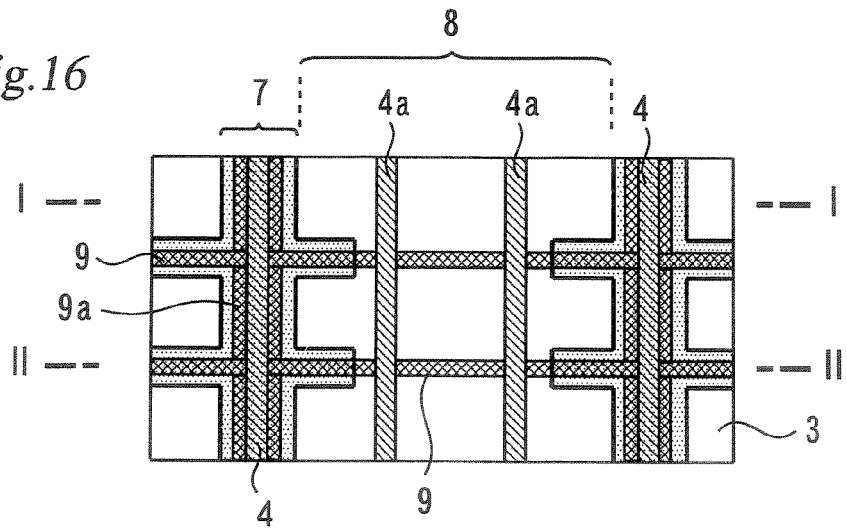
FIG. 16 is a plan view of an insulated gate semiconductor device according to the third variation in the second embodiment.
Figure 17:
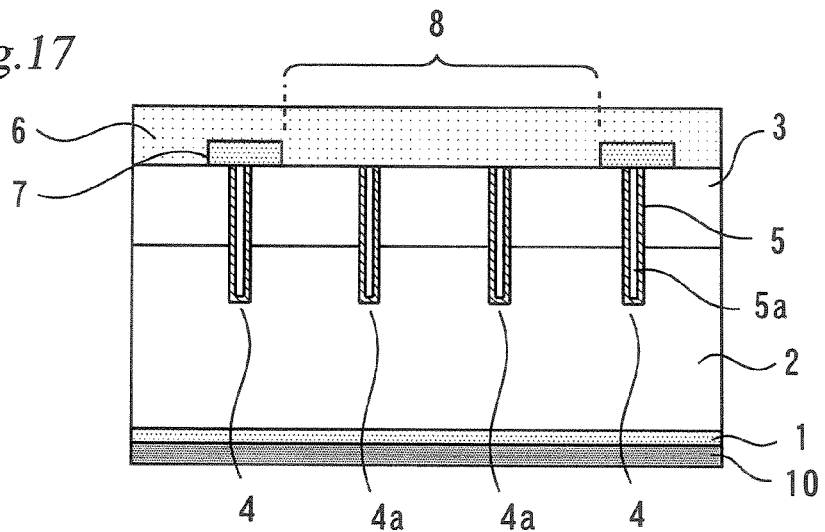
FIGS. 17 and 18 are cross-sectional views of an insulated gate semiconductor device according to the third variation in the second embodiment.
Figure 18:
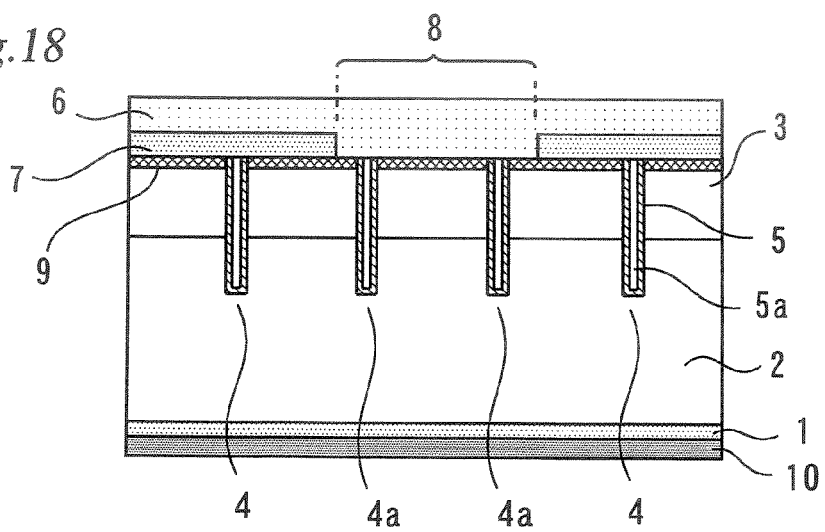

A third variation of the second embodiment will now be described with reference to FIGS. 16 to 18. FIG. 16 is a plan view of an insulated gate semiconductor device according to this variation. FIGS. 17 and 18 are cross-sectional views taken along lines I-I and II-II, respectively, of FIG. 16.

Referring to FIGS. 16 to 18, two dummy trenches 4a are provided between each two adjacent trenches 4. All other components and structures are similar to those described in connection with the second variation (shown in FIGS. 13 to 15). This configuration also can produce the same effect as the configuration shown in FIGS. 7 to 9.

Figure 19:
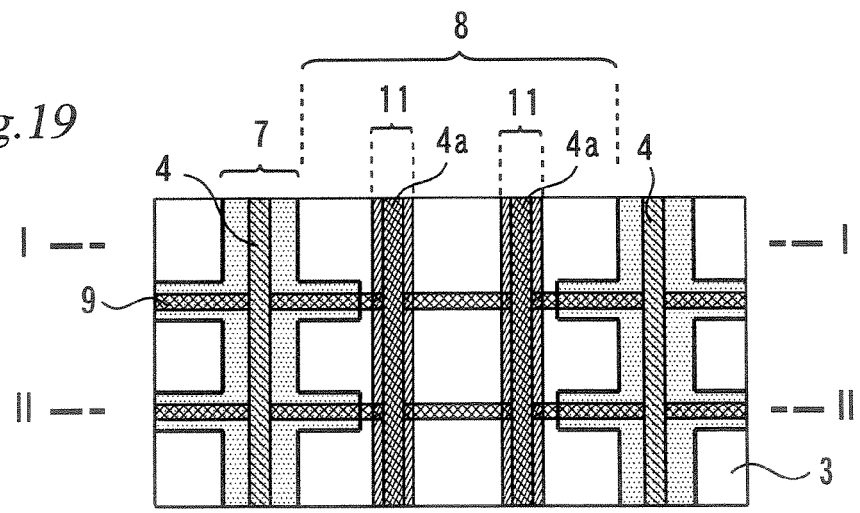
FIG. 19 is a plan view of an insulated gate semiconductor device according to the fourth variation in the second embodiment.
Figure 20:
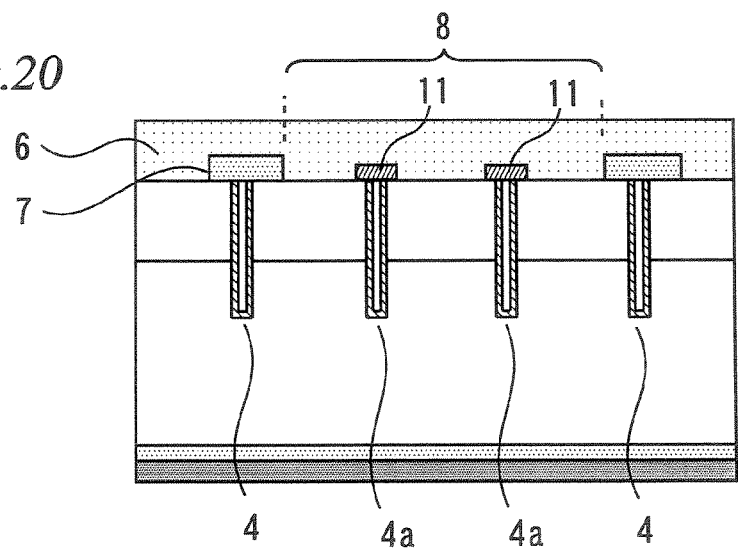
FIGS. 20 and 21 are cross-sectional views of an insulated gate semiconductor device according to the fourth variation in the second embodiment.
Figure 21:
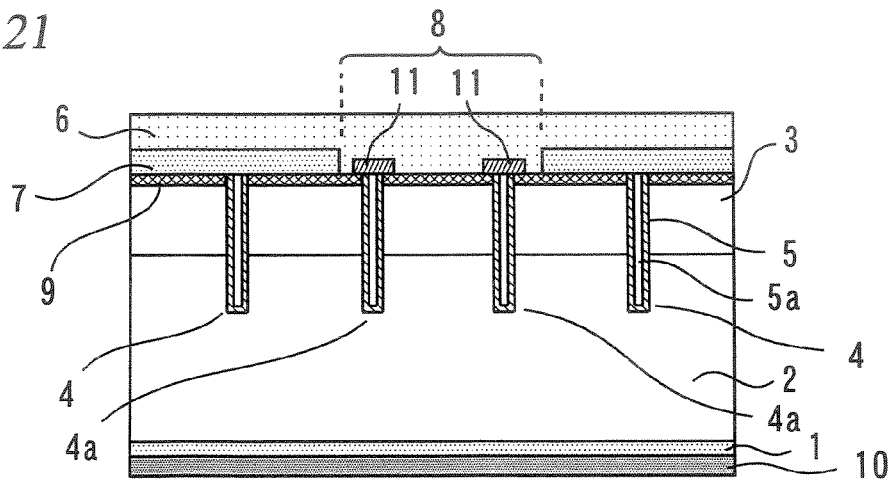

A fourth variation of the second embodiment will now be described with reference to FIGS. 19 to 21. FIG. 19 is a plan view of an insulated gate semiconductor device according to this variation. FIGS. 20 and 21 are cross-sectional views taken along lines I-I and II-II, respectively, of FIG. 19.

Referring to FIGS. 19 to 21, conductive film patterns 11 having the same conductive type as the emitter diffusion layer region 9, are formed so as to cover the top surfaces of the dummy trenches 4a. These conductive film patterns 11 are formed of, for example, polysilicon. More specifically, the conductive film patterns 11 are formed above the semiconductor substrate 2 so as to connect between the first emitter diffusion layers 9 on both sides of each dummy trench 4a.

In this configuration, the first emitter diffusion layers 9 on both sides of each dummy trench 4a are electrically connected to each other, thereby increasing the contact areas between the emitter electrode 6 and these emitter diffusion layers. That is, the conductive film pattern 11 formed over each dummy trench 4a provide electrical connections between the emitter electrode 6 and the first emitter diffusion layers 9 on both sides of the dummy trench 4a, thereby reducing their contact resistance in the contact regions 8.

Figure 22:
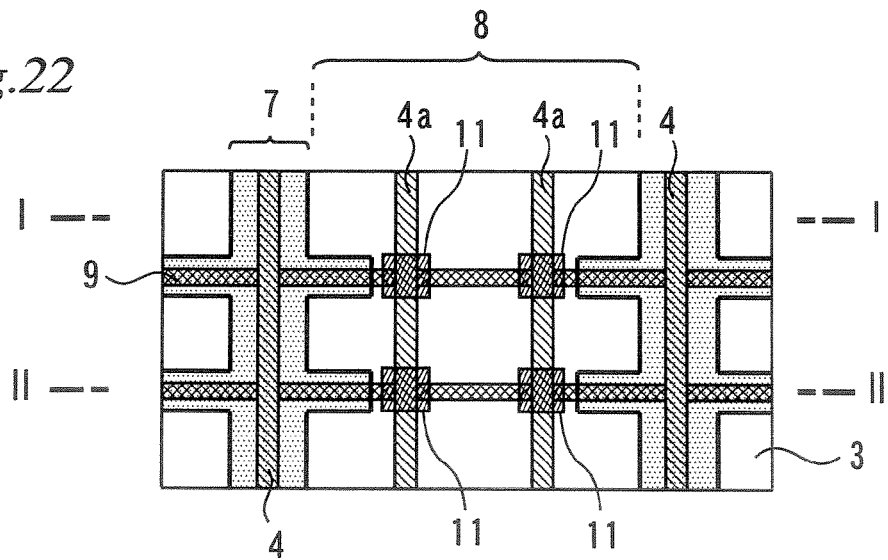
FIG. 22 is a plan view of an insulated gate semiconductor device according to the fifth variation in the second embodiment.
Figure 23:
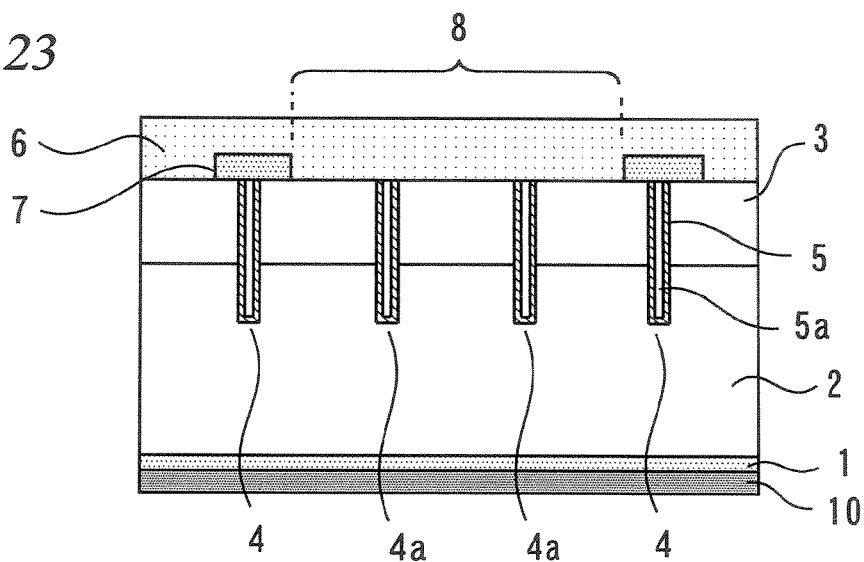
FIGS. 23 and 24 are cross-sectional views of an insulated gate semiconductor device according to the fifth variation in the second embodiment.
Figure 24:
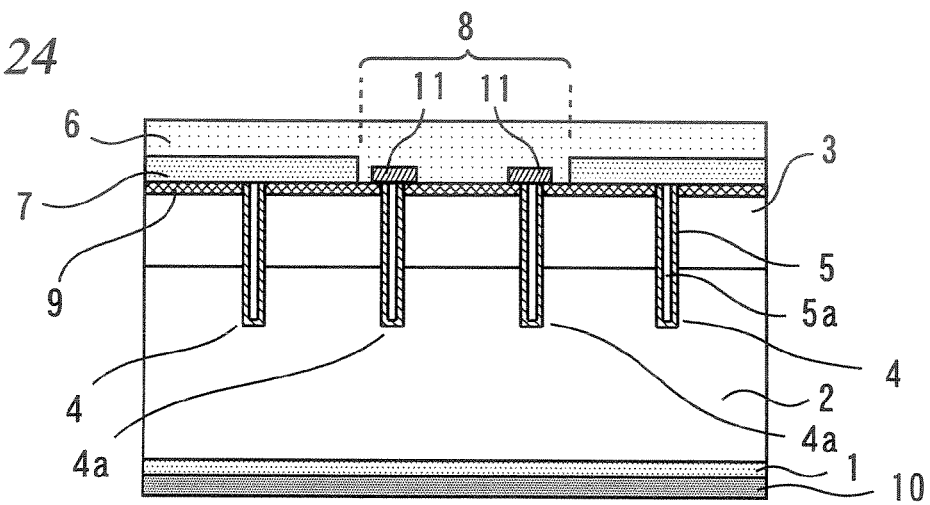

A fifth variation of the second embodiment will now be described with reference to FIGS. 22 to 24. FIG. 22 is a plan view of an insulated gate semiconductor device according to this variation. FIGS. 23 and 24 are cross-sectional views taken along lines I-I and II-II, respectively, of FIG. 22.

Referring to FIGS. 22 and 24, conductive film patterns 11 having a strip shape are formed in the narrowed portions of the contact regions 8 so as to cover the top surfaces of dummy trenches 4a. These conductive film patterns 11, like those of the second variation, connect between the first emitter diffusion layers 9 on both sides of each dummy trench 4a. This variation can produce the same effect as the above second variation.

Figure 25:
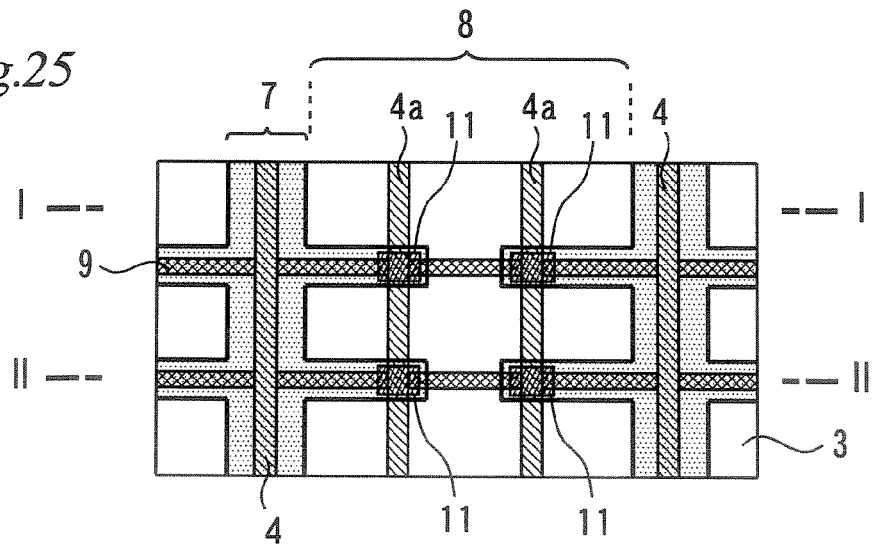
FIG. 25 is a plan view of an insulated gate semiconductor device according to the sixth variation in the second embodiment.
Figure 26:
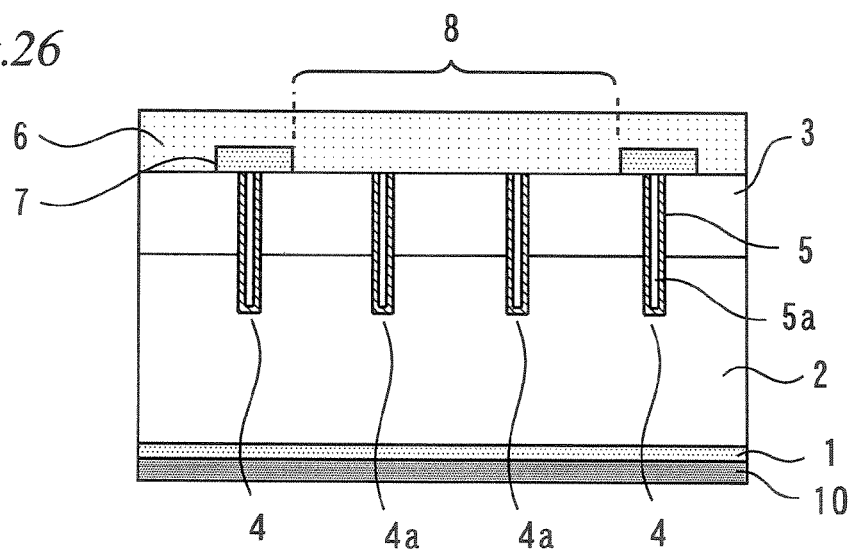
FIGS. 26 and 27 are cross-sectional views of an insulated gate semiconductor device according to the sixth variation in the second embodiment.
Figure 27:
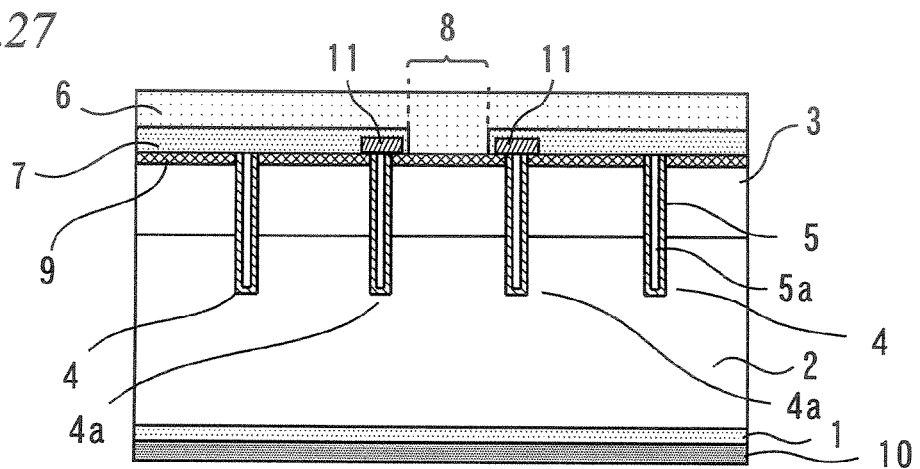

A sixth variation of the second embodiment will now be described with reference to FIGS. 25 to 27. FIG. 25 is a plan view of an insulated gate semiconductor device according to this variation. FIGS. 26 and 27 are cross-sectional views taken along lines I-I and II-II, respectively, of FIG. 25.

In the cross section shown in FIG. 27 taken along line II-II of FIG. 25, interlayer films 7 cover the top surfaces of dummy trenches 4a. Conductive film patterns 11 are formed in these interlayer films 7 above the semiconductor substrate 2 so as to connect between the first emitter diffusion layers 9 on both sides of the dummy trenches 4a, as shown in FIG. 27.

The above configuration provides an increase in the distance that the first emitter diffusion layers 9 on both sides of trenches 4 extend to an edge of a contact region 8, as shown in FIG. 27. This allows for an increase in the emitter ballast resistance.

Third Embodiment

Figure 28:
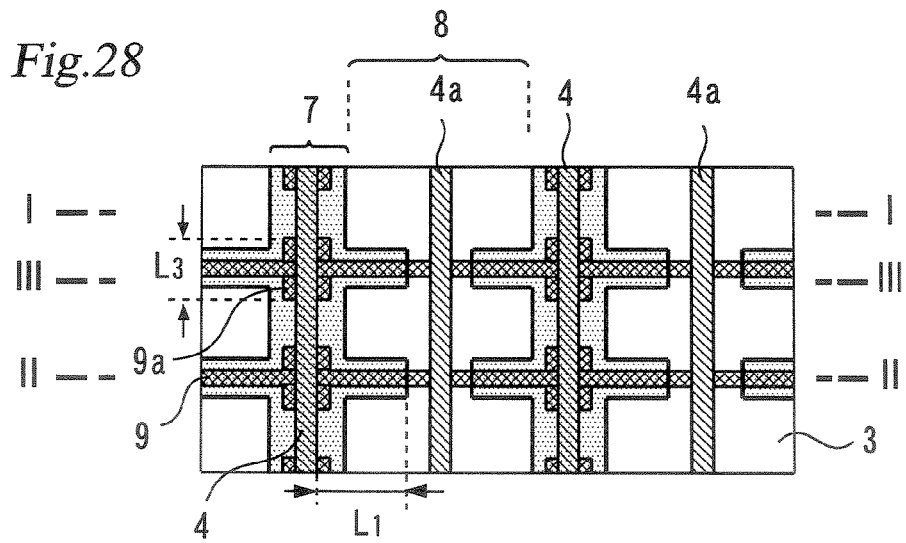
FIG. 28 is a plan view of an insulated gate semiconductor device according to the third embodiment.
Figure 29:
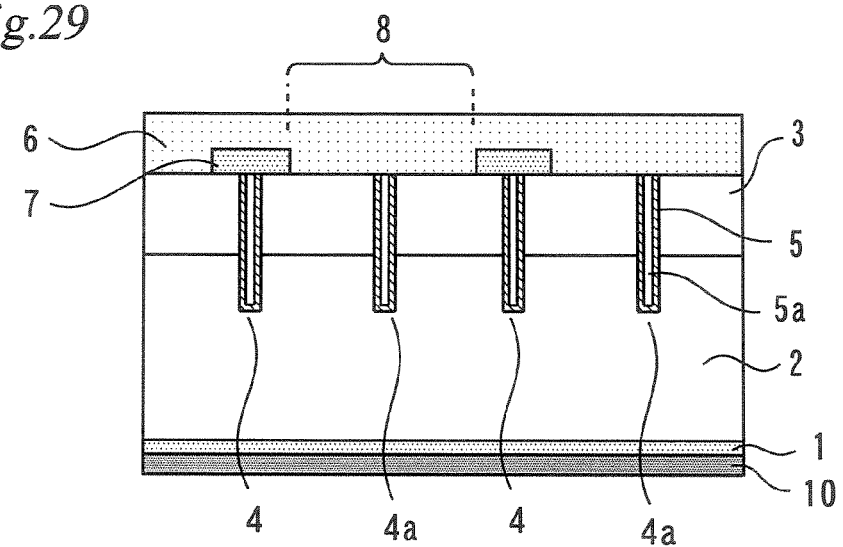
FIGS. 29, 30 and 31 are cross-sectional views of an insulated gate semiconductor device according to the third embodiment.
Figure 30:
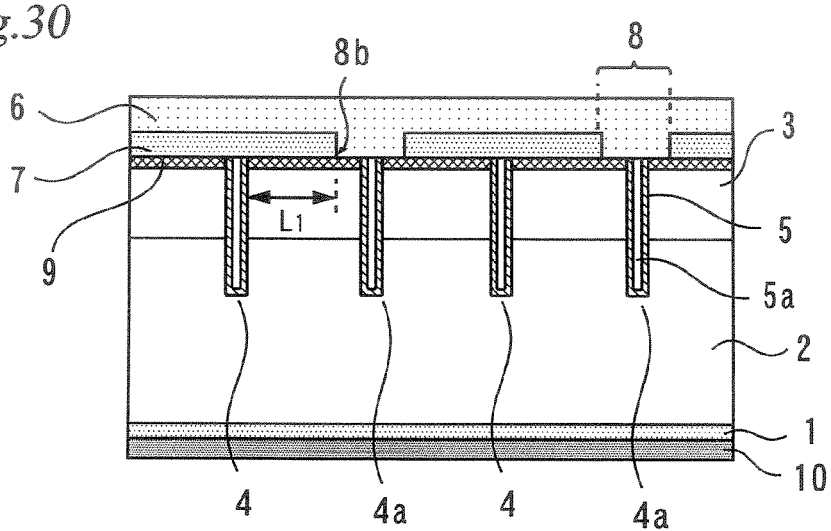
Figure 31:
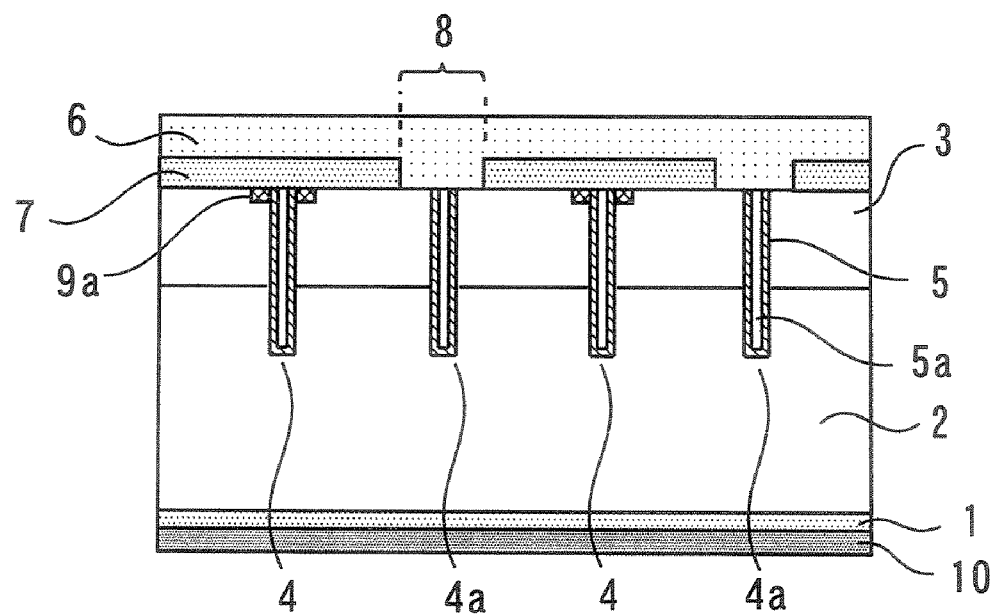

A description will now be made of an insulated gate semiconductor device according to a third embodiment of the present invention with reference to FIGS. 28 to 31. The following description will focus on the differences from the second embodiment. FIG. 28 is a plan view of the insulated gate semiconductor device according to this embodiment FIGS. 29 to 31 are cross-sectional views taken along lines I-I, II-II, and III-III, respectively, of FIG. 28.

Referring to FIG. 28, a plurality of trenches 4 are arranged in stripes, and a dummy trench 4a is provided between each two adjacent trenches 4. Further, second emitter diffusion layers 9a having a strip shape are provided in contact with respective sides of each trench 4 and connected to one end of their respective first emitter diffusion layers 9, as shown in FIGS. 28 and 31. The first emitter diffusion layers 9 and the second emitter diffusion layers 9a together form T-shaped emitter diffusion layers. All other components and structures are similar to those described in connection with the second embodiment.

In the insulated gate semiconductor device of the second embodiment shown in FIG. 7, the smaller the width $L_2$ of the first emitter diffusion layers 9 in the longitudinal direction of the trenches 4, the higher the resistance to electrical breakdown. However, a reduction in the width $L_2$ of the first emitter diffusion layers 9 results in an increase in its percentage variation (that is, the ratio of the actual value to the design value of the width $L_2$) due to wafer process variations, such as variations in the lithographic process, ion implantation, and diffusion processes, etc., increasing variations in the saturation current.

On the other hand, the insulated gate semiconductor device of the third embodiment shown in FIG. 28 additionally includes the above second emitter diffusion layers 9*a* which, together with the first emitter diffusion layers 9, form T-shaped emitter diffusion layers. This arrangement prevents variations in the channel width due to variations in the width of the emitter diffusion layers 9*a* in a direction intersecting the trenches 4.

Therefore, the third embodiment can reduce variations in the saturation current, as compared to the second embodiment.

Further according to the third embodiment, a width ($L_3$) of the T-shaped emitter diffusion layers in the longitudinal direction of the trenches 4 is preferably smaller than the distance $L_1$ between each trench 4 and a lower left edge or lower right edge 8*b* of each contact region 8 adjacent thereto on the T-shaped emitter diffusion layers (see FIGS. 28 and 30).

In this configuration, the ballast resistance components determined by the emitter diffusion layers intersecting the trenches 4 are larger than the ballast resistance components determined by the emitter diffusion layers extending in the longitudinal direction of the trenches 4. It should be noted that the latter ballast resistance components tend to vary due to variations in the width of the trenches 4. Therefore, this configuration can reduce variations in the saturation current due to variations in the width of the trenches 4.

Figure 32:
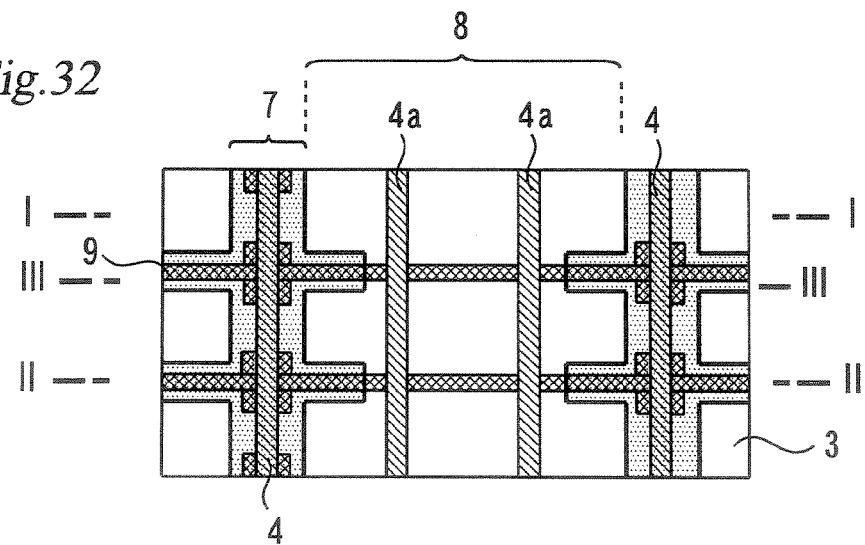
FIG. 32 is a plan view of an insulated gate semiconductor device according to the first variation in the third embodiment.
Figure 33:
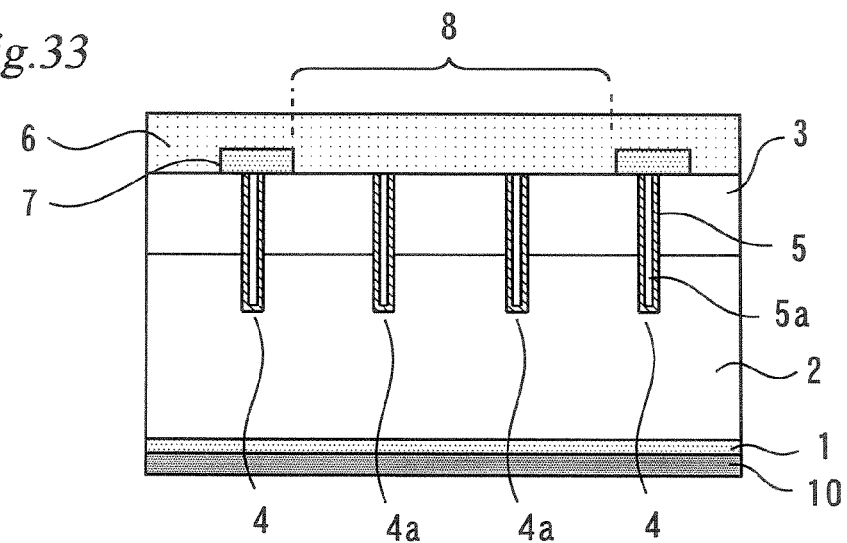
FIGS. 33, 34 and 35 are cross-sectional views of an insulated gate semiconductor device according to the first variation in the third embodiment.
Figure 34:
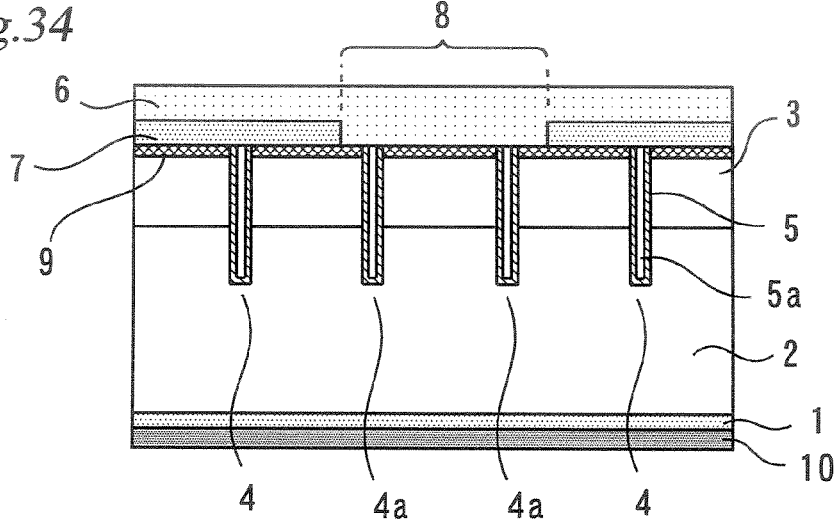
Figure 35:
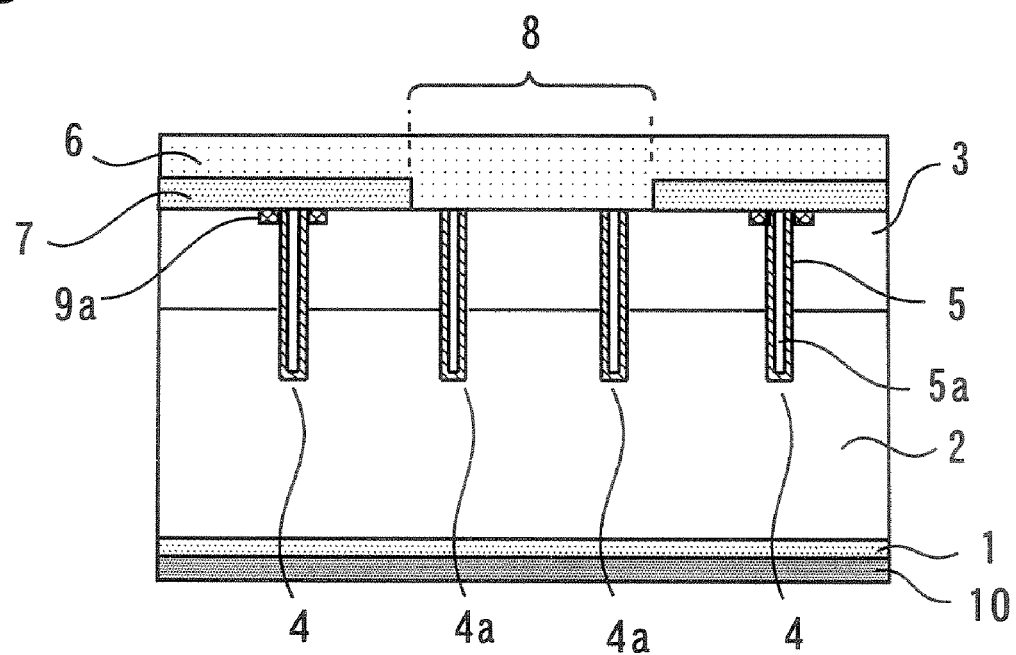

A first variation of the third embodiment will be described with reference to FIGS. 32 to 35. FIG. 32 is a plan view of an insulated gate semiconductor device according to this variation. FIGS. 33 to 35 are cross-sectional views taken along lines I-I, II-II, and III-III, respectively, of FIG. 32.

Referring to FIGS. 32 to 35, two dummy trenches 4*a* are provided between each two adjacent trenches 4. All other components and structures are similar to those of the above insulated gate semiconductor device shown in FIGS. 28 to 31 according to the third embodiment. Although not shown in the figures, three or more dummy trenches 4*a*, instead of just two, may be provided between each two adjacent trenches 4. That is, a similar configuration that includes any plurality of dummy trenches 4*a* between each two adjacent trenches 4 can produce the same effect as the configuration shown in FIGS. 28 to 31.

Figure 36:
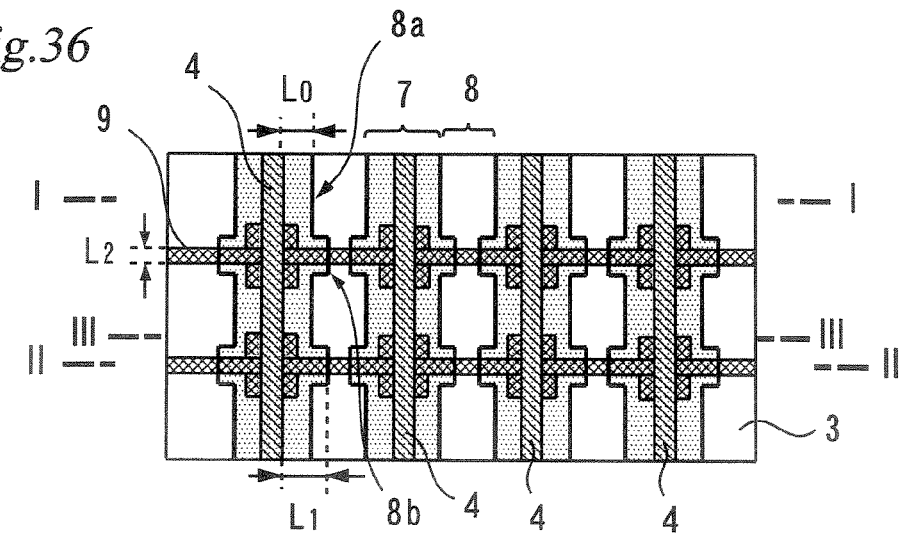
FIG. 36 is a plan view of an insulated gate semiconductor device according to the second variation in the third embodiment.
Figure 37:
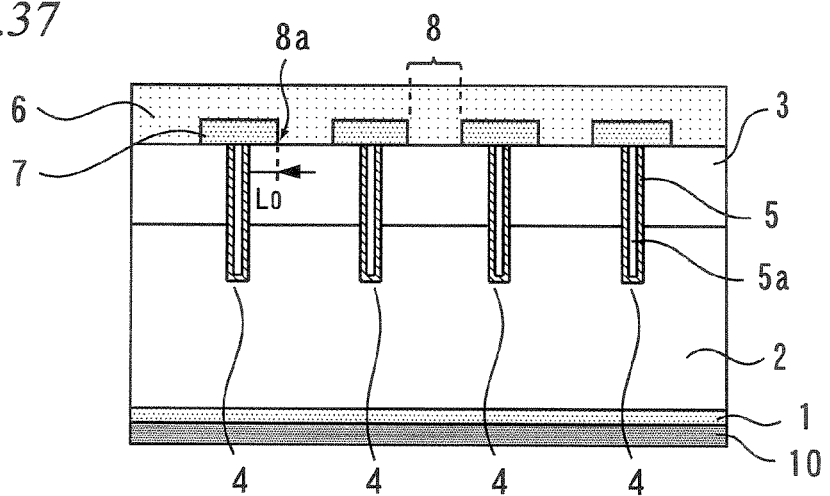
FIGS. 37, 38 and 39 are cross-sectional views of an insulated gate semiconductor device according to the second variation in the third embodiment.
Figure 38:
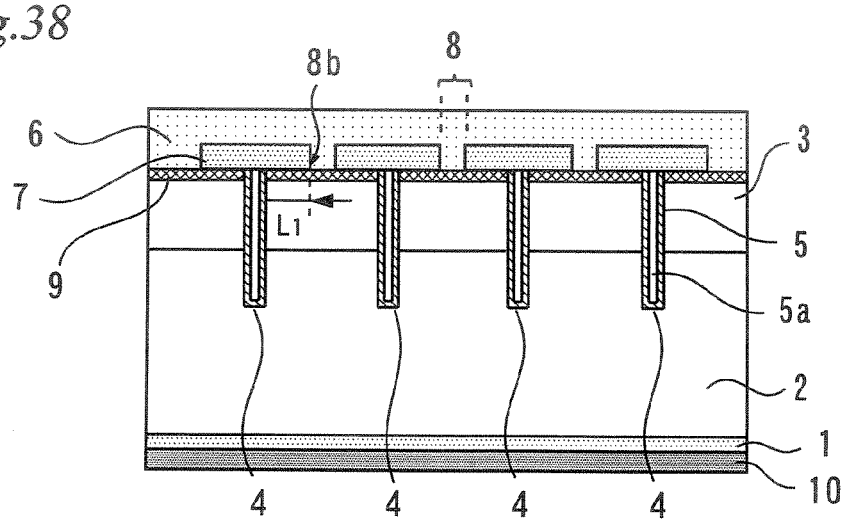
Figure 39:
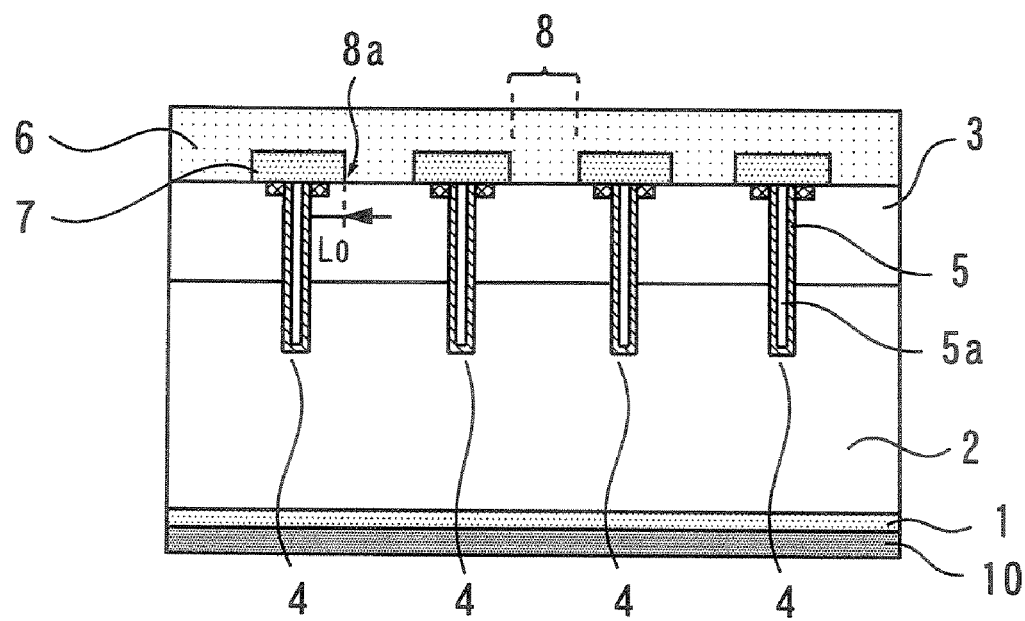

A second variation of the third embodiment will be described with reference to FIGS. 36 to 39. FIG. 36 is a plan view of an insulated gate semiconductor device according to this variation. FIGS. 37 to 39 are cross-sectional views taken along lines I-I, II-II, and III-III, respectively, of FIG. 36.

Referring to FIGS. 36 to 39, this insulated gate semiconductor device does not include a dummy trench between adjacent trenches 4. All other components and structures are similar to those of the insulated gate semiconductor device shown in FIGS. 28 to 31 according to the third embodiment. This configuration also can produce the same effect as the configuration shown in FIGS. 28 to 31.

Figure 40:
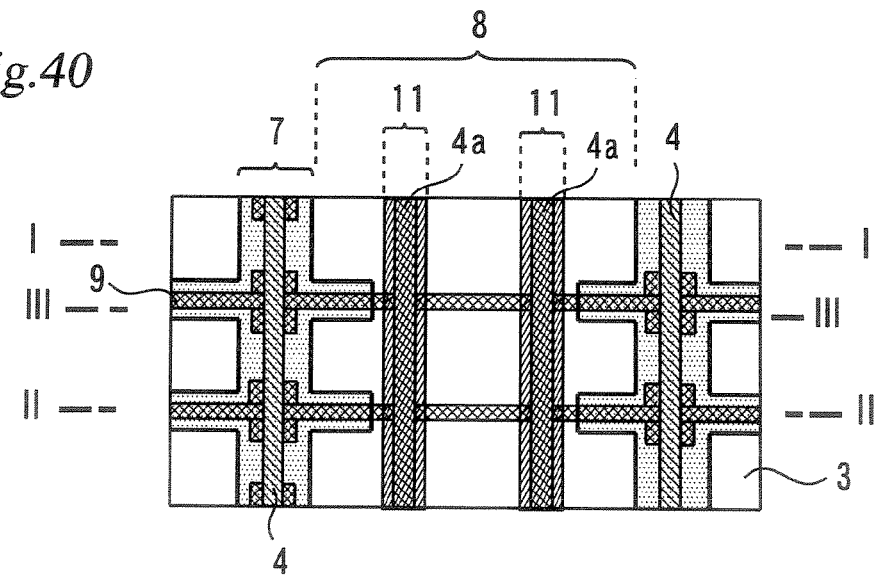
FIG. 40 is a plan view of an insulated gate semiconductor device according to the third variation in the third embodiment.
Figure 41:
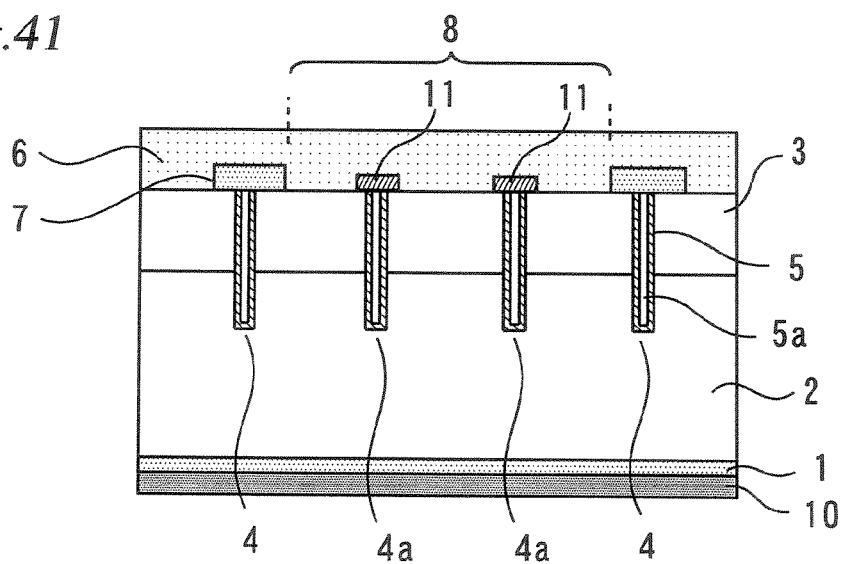
FIGS. 41, 42 and 43 are cross-sectional views of an insulated gate semiconductor device according to the third variation in the third embodiment.
Figure 42:
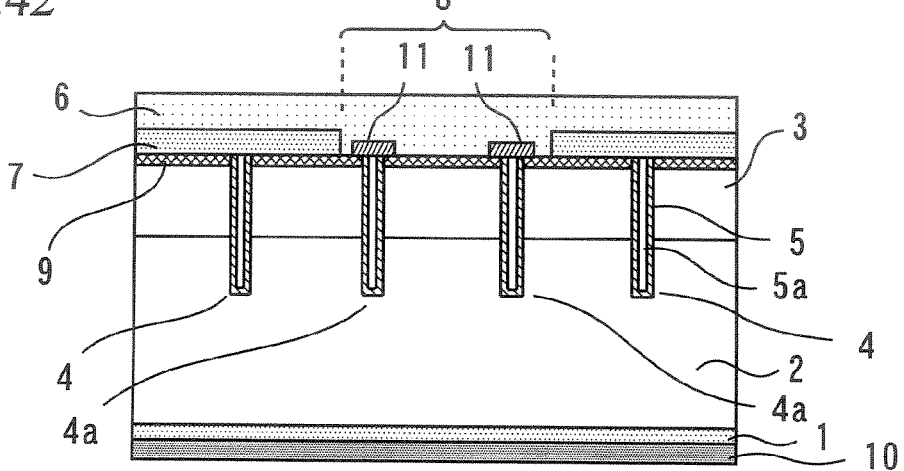
Figure 43:
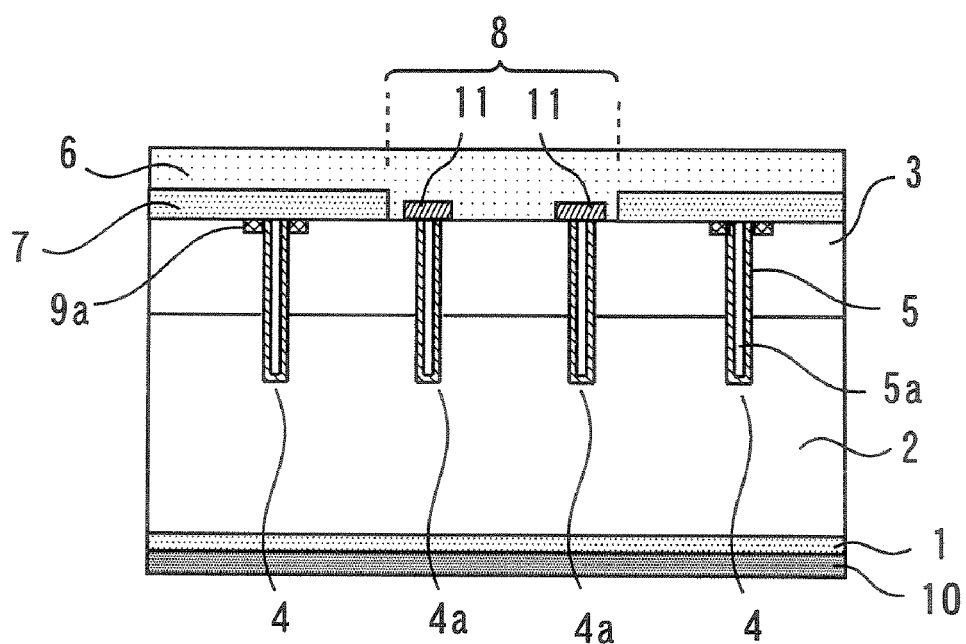

A third variation of the third embodiment will be described with reference to FIGS. 40 to 43. FIG. 40 is a plan view of an insulated gate semiconductor device according to this variation. FIGS. 41 to 43 are cross-sectional views taken along lines I-I, II-II, and III-III, respectively, of FIG. 41.

Referring to FIGS. 40 to 43, conductive film patterns 11 having the same conductive type as the emitter diffusion layer region 9, are formed so as to cover the top surfaces of the dummy trenches 4*a*. These conductive film patterns 11 are formed of, for example, polysilicon. More specifically, the conductive film patterns 11 are formed above the semiconductor substrate 2 so as to connect between the first emitter diffusion layers 9 on both sides of each dummy trench 4*a*.

In this configuration, the first emitter diffusion layers 9 on both sides of each dummy trench 4*a* are electrically connected to each other as shown in FIG. 42, thereby increasing the contact areas between the emitter electrode 6 and these emitter diffusion layers 9. That is, the conductive film patterns 11 formed over each dummy trench 4*a* provide electrical connections between the emitter electrode 6 and the first emitter diffusion layers 9 on both sides of the dummy trench 4*a*, thereby reducing their contact resistance in the contact regions 8.

Figure 44:
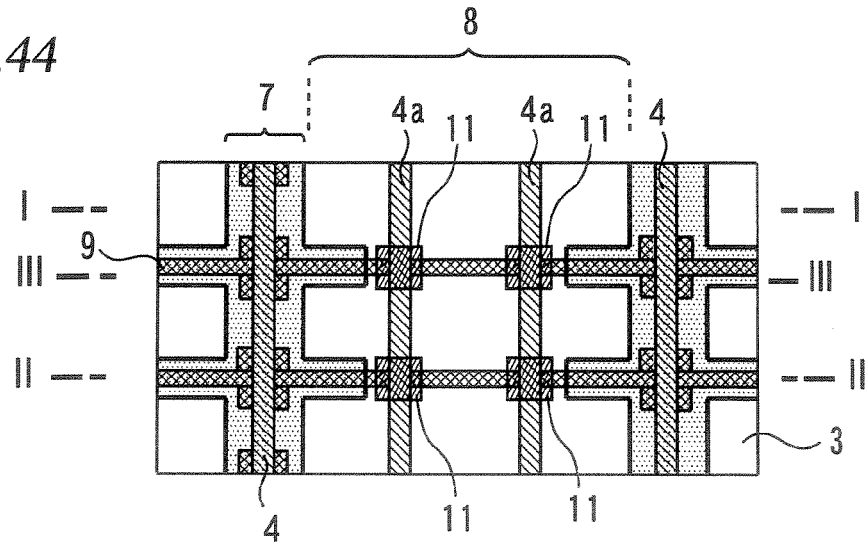
FIG. 44 is a plan view of an insulated gate semiconductor device according to the fourth variation in the third embodiment.
Figure 45:
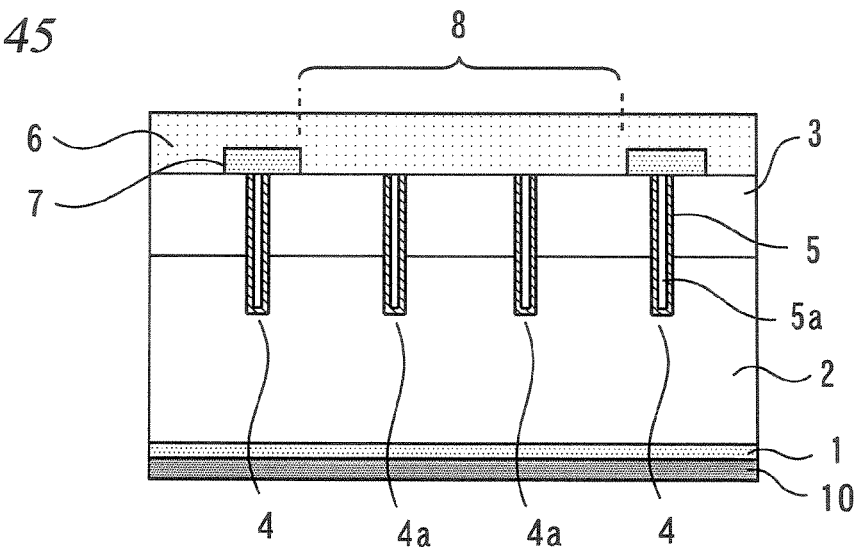
FIGS. 45, 46 and 47 are cross-sectional views of an insulated gate semiconductor device according to the fourth variation in the third embodiment.
Figure 46:
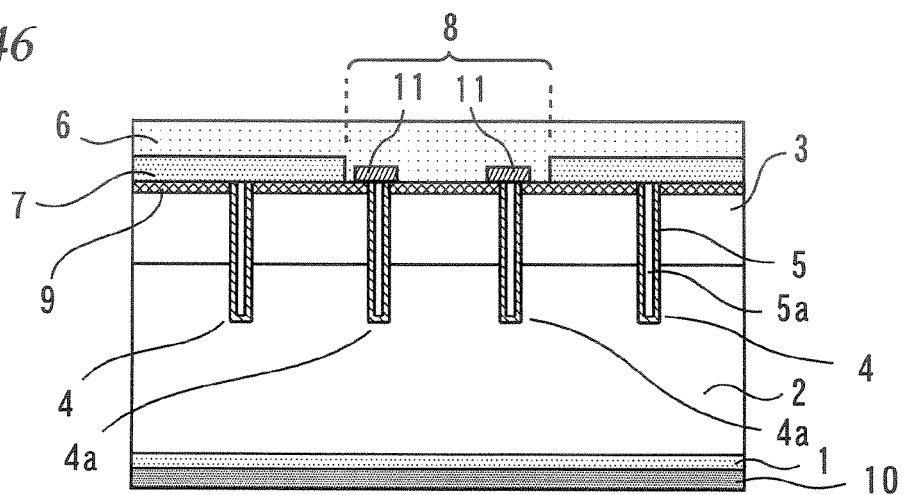
Figure 47:
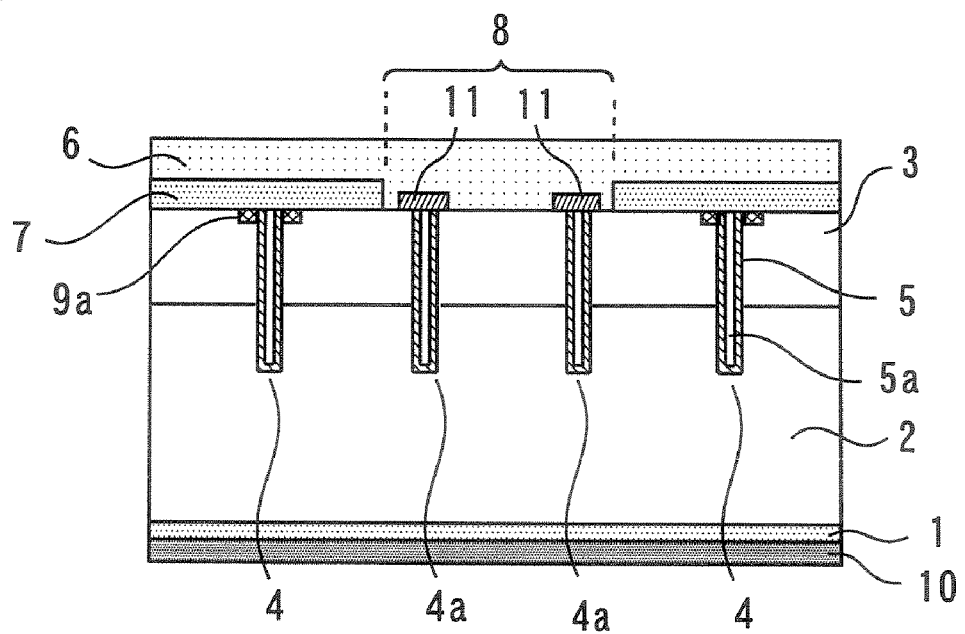

A fourth variation of the third embodiment will be described with reference to FIGS. 44 to 47. FIG. 44 is a plan view of an insulated gate semiconductor device according to this variation. FIGS. 45 to 47 are cross-sectional views taken along lines I-I, II-II, and III-III, respectively, of FIG. 44.

Referring to FIGS. 44, 46, and 47, conductive film patterns 11 having a strip shape are formed in the narrowed portions of the contact regions 8 so as to cover the top surfaces of dummy trenches 4*a*. These conductive film patterns 11 connect between the first emitter diffusion layers 9 on both sides of each dummy trench 4*a* as shown in FIG. 46. Therefore, this variation can produce the same effect as the above third variation.

Fourth Embodiment

Figure 48:
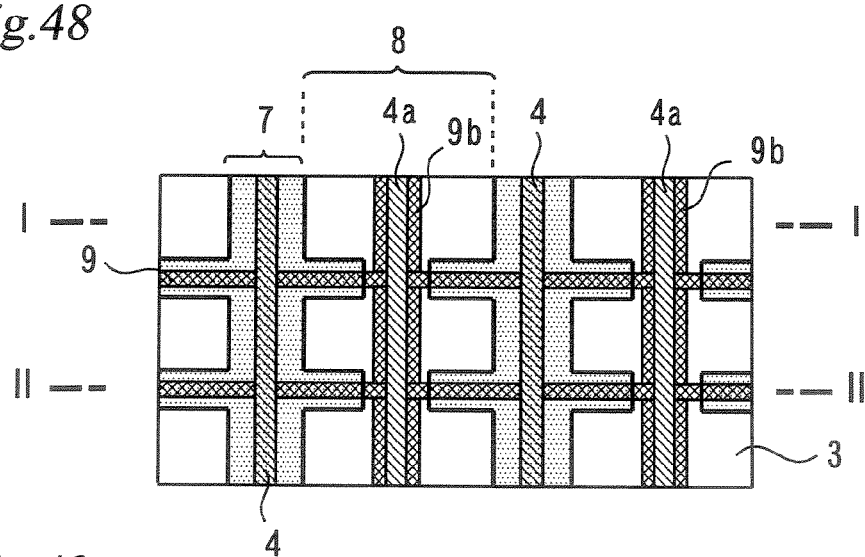
FIG. 48 is a plan view of an insulated gate semiconductor device according to the fourth embodiment.
Figure 49:
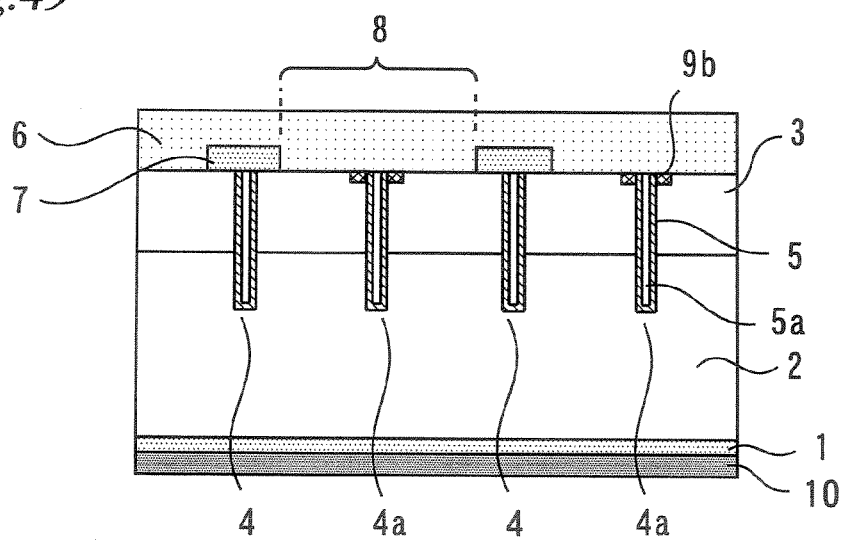
FIGS. 49 and 50 are cross-sectional views of an insulated gate semiconductor device according to the fourth embodiment.
Figure 50:
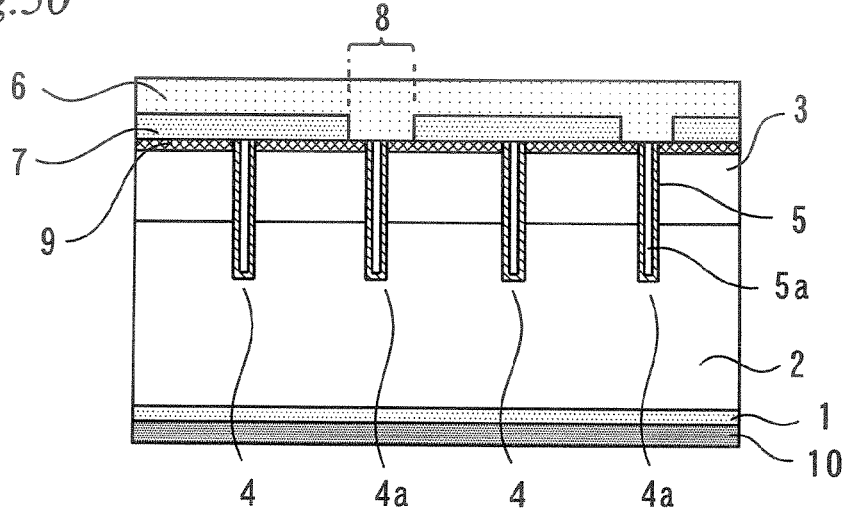

A description will now be made of an insulated gate semiconductor device according to a fourth embodiment of the present invention with reference to FIGS. 48 to 50. The following description will focus on the differences from the second embodiment. FIG. 48 is a plan view of the insulated gate semiconductor device according to this embodiment. FIGS. 49 and 50 are cross-sectional views taken along lines I-I and II-II, respectively, of FIG. 48.

Referring to FIG. 48, a plurality of trenches 4 are arranged in stripes, and a dummy trench 4*a* is provided between each two adjacent trenches 4. Further, a plurality of first emitter diffusion layers 9 are formed so as to extend in a direction intersecting the trenches 4 and the dummy trenches 4*a*.

Further, third emitter diffusion layers 9*b* having a strip shape are formed in contact with respective sides of each dummy trench 4*a* so as to connect between adjacent first emitter diffusion layers 9. The pluralities of first emitter diffusion layers 9 and third emitter diffusion layers 9*b* together form a comb-shaped emitter diffusion layer. All other components and structures are similar to those described in connection with the second embodiment.

In the insulated gate semiconductor device of the second embodiment shown in FIG. 7, the width $L_2$ of each first emitter diffusion layer 9 in the longitudinal direction of the trenches 4 may be reduced to increase the emitter ballast resistance and thereby reduce the transfer characteristics, or gain. However, a reduction in the width $L_2$ results in a reduction in the contact areas between the emitter electrode 6 and the first emitter diffusion layers 9. This increases the contact resistance and hence the turn-on voltage.

In the insulated gate semiconductor device of the fourth embodiment, on the other hand, third emitter diffusion layers 9*b* are provided on both sides of each dummy trench 4*a*, as described above. This configuration allows sufficient contact areas to be formed between the emitter electrode and the emitter diffusion layers even when the width of the first emitter diffusion layers 9 in the longitudinal direction of the trenches 4 is reduced.

Therefore, in addition to having the same effect as the second embodiment, the fourth embodiment allows for a reduction in the turn-on voltage while reducing the transfer characteristics.

Figure 51:
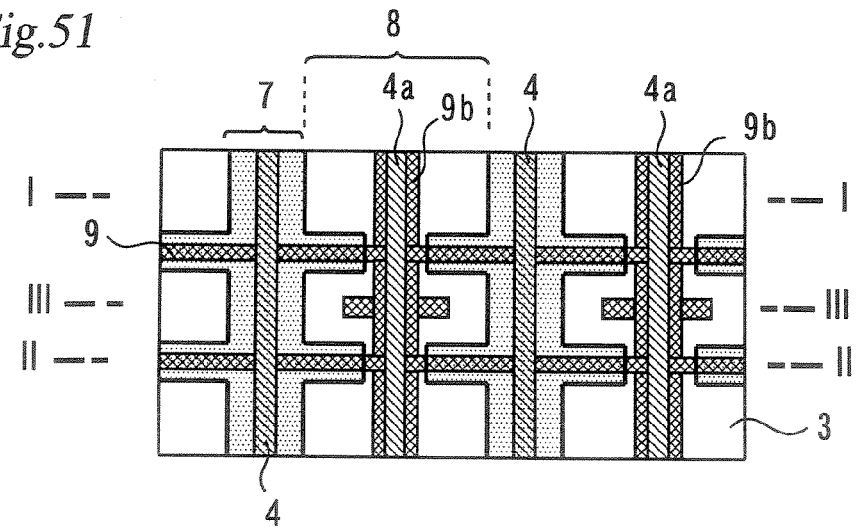
FIG. 51 is a plan view of an insulated gate semiconductor device according to the first variation in the fourth embodiment.
Figure 52:
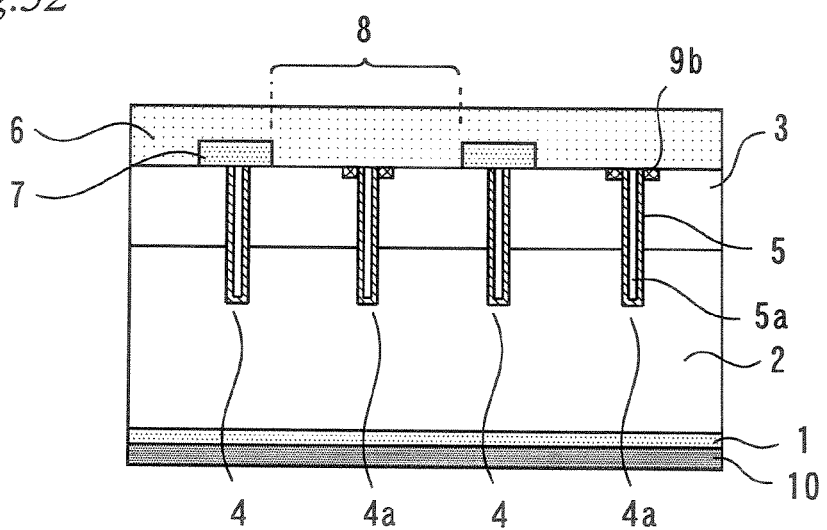
FIGS. 52, 53 and 54 are cross-sectional views of an insulated gate semiconductor device according to the first variation in the fourth embodiment.
Figure 53:
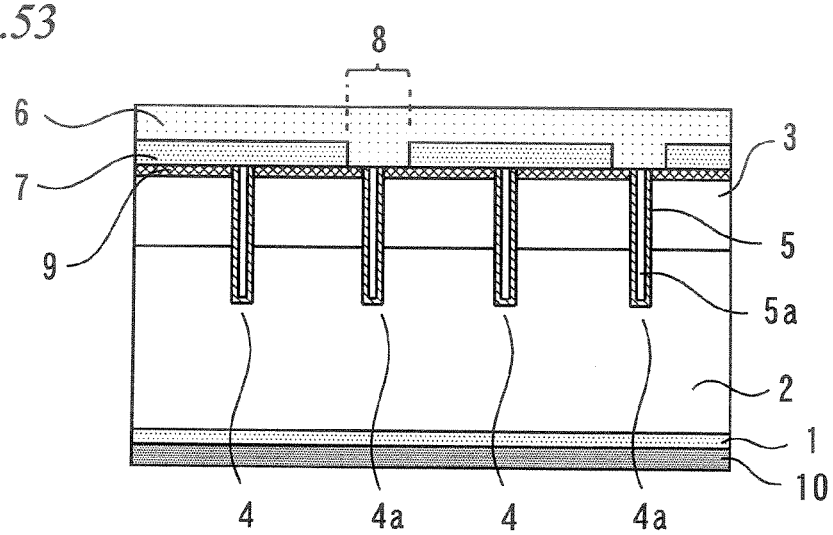
Figure 54:
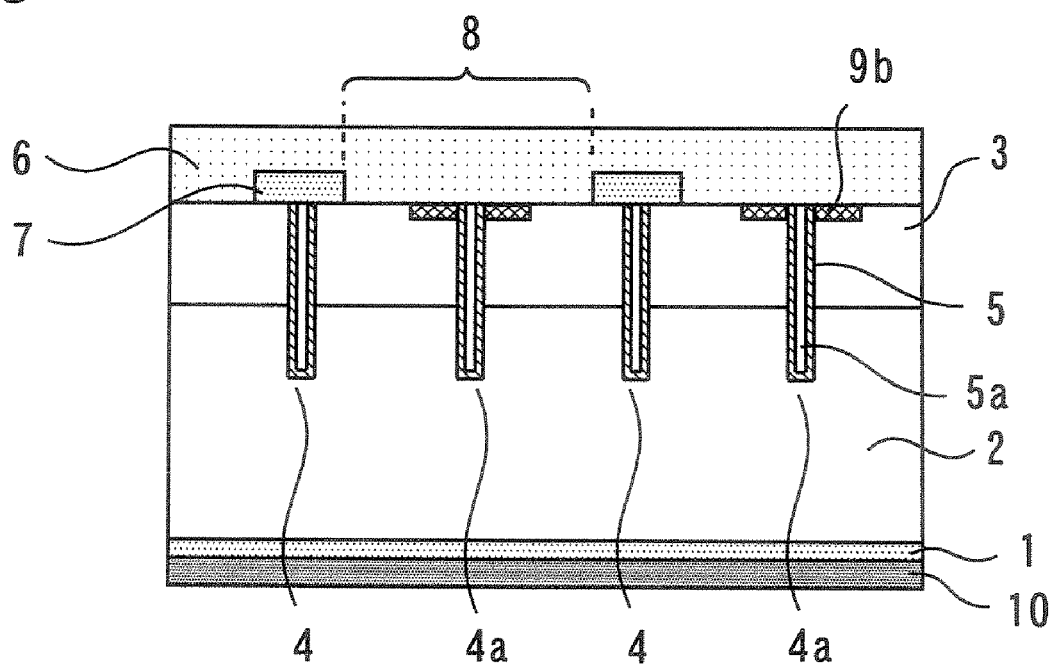

A first variation of the fourth embodiment will be described with reference to FIGS. 51 to 54. FIG. 51 is a plan view of an insulated gate semiconductor device according to this variation. FIGS. 52 to 54 are cross-sectional views taken along lines I-I, II-II, and III-III, respectively, of FIG. 51.

In this variation, portions of the third emitter diffusion layers 9b under contact regions 8 are widen to increase the contact areas between the emitter electrode and the emitter diffusion layers, as shown in FIG. 51. All other components and structures are similar to those of the above insulated gate semiconductor device shown in FIGS. 48 to 50 according to the fourth embodiment) This configuration can produce the same effect as the configuration shown in FIGS. 48 to 50.

Figure 55:
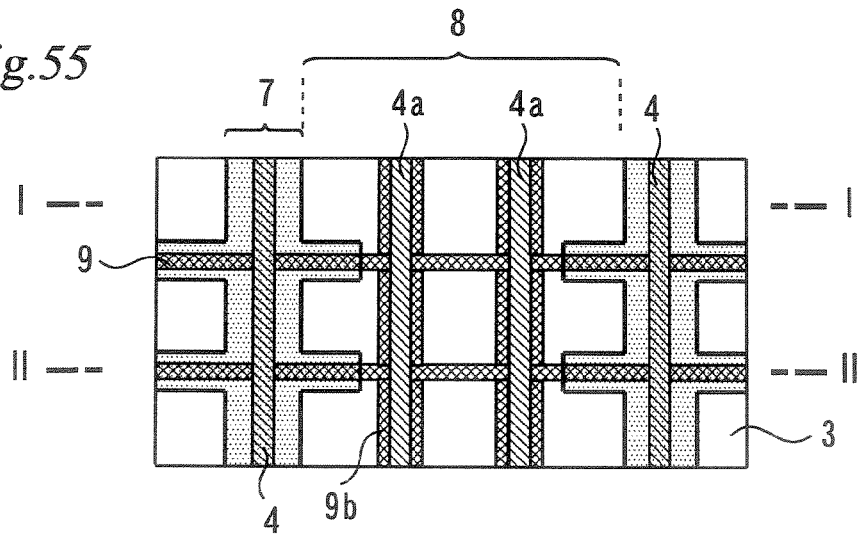
FIG. 55 is a plan view of an insulated gate semiconductor device according to the second variation in the fourth embodiment.
Figure 56:
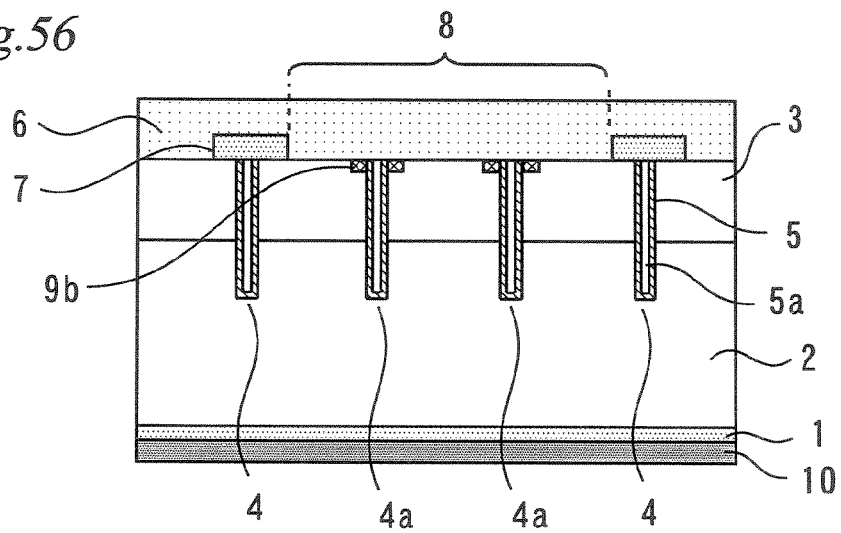
FIGS. 56 and 57 are cross-sectional views of an insulated gate semiconductor device according to the second variation in the fourth embodiment.
Figure 57:
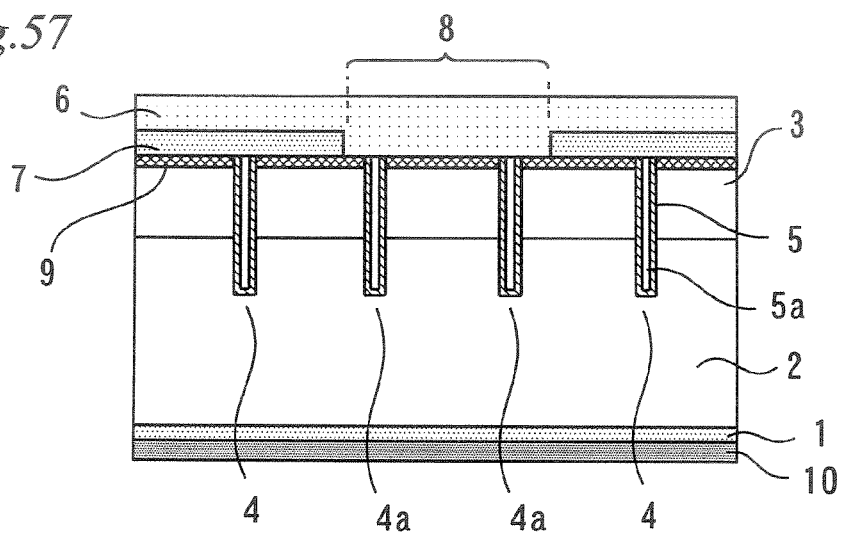

A second variation of the fourth embodiment will be described with reference to FIGS. 55 to 57. FIG. 55 is a plan view of an insulated gate semiconductor device according to this variation. FIGS. 56 and 57 are cross-sectional views taken along lines I-I and II-II, respectively, of FIG. 55.

Referring to FIGS. 55 to 57, two dummy trenches 4a are provided between each two adjacent trenches 4. All other components and structures are similar to those of the above insulated gate semiconductor device shown in FIGS. 48 to 50 according to the fourth embodiment. This configuration also can produce the same effect as the configuration shown in FIGS. 48 to 50.

Figure 58:
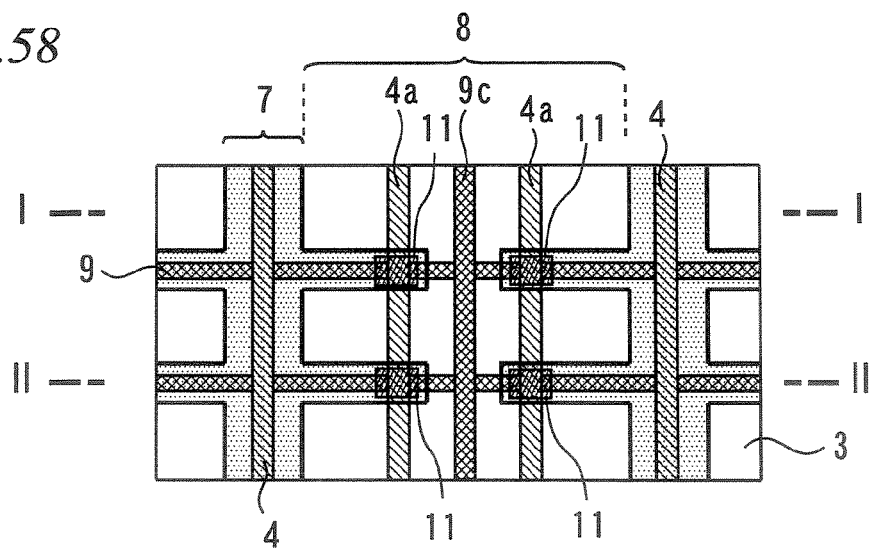
FIG. 58 is a plan view of an insulated gate semiconductor device according to the third variation in the fourth embodiment.
Figure 59:
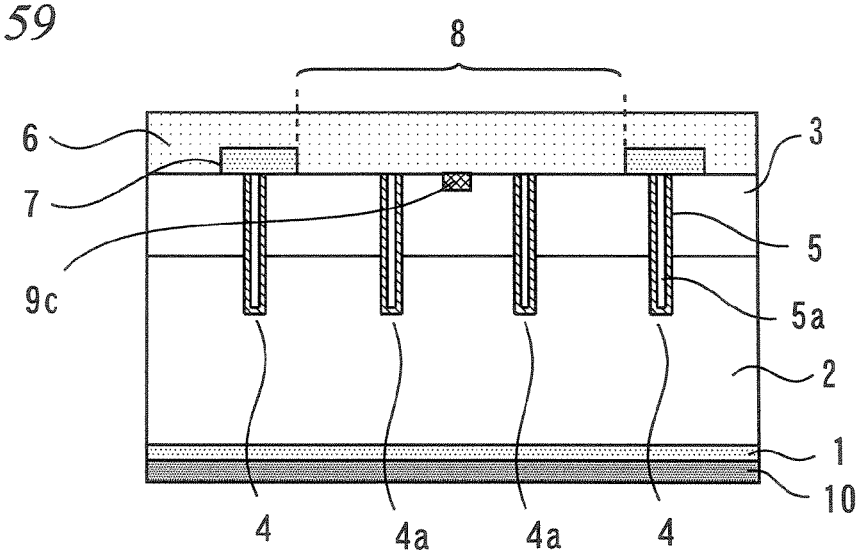
FIGS. 59 and 60 are cross-sectional views of an insulated gate semiconductor device according to the third variation in the fourth embodiment.
Figure 60:
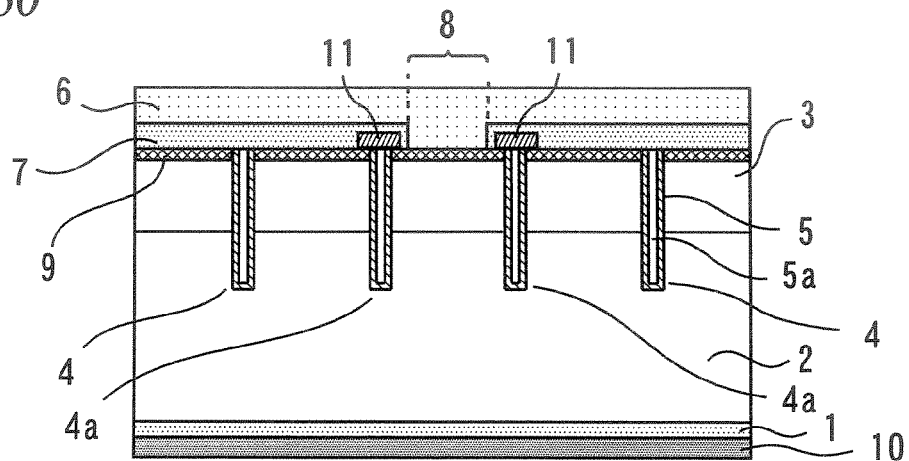

A third variation of the fourth embodiment will be described with reference to FIGS. 58 to 60. FIG. 58 is a plan view of an insulated gate semiconductor device according to this variation. FIGS. 59 and 60 are cross-sectional views taken along lines I-I and II-II, respectively, of FIG. 58.

In the cross section shown in FIG. 60 taken along line II-II of FIG. 58, interlayer films 7 cover the top surfaces of dummy trenches 4a. Conductive film patterns 11 are formed in these interlayer films 7 above the semiconductor substrate 2 so as to connect between the first emitter diffusion layers 9 on both sides of the dummy trenches 4a, as shown in FIG. 60.

The above configuration provides an increase in the distance that the first emitter diffusion layers 9 on both sides of trenches 4 extend to an edge of a contact region 8, as shown in FIG. 60. This allows for an increase in the emitter ballast resistance.

Figure 61:
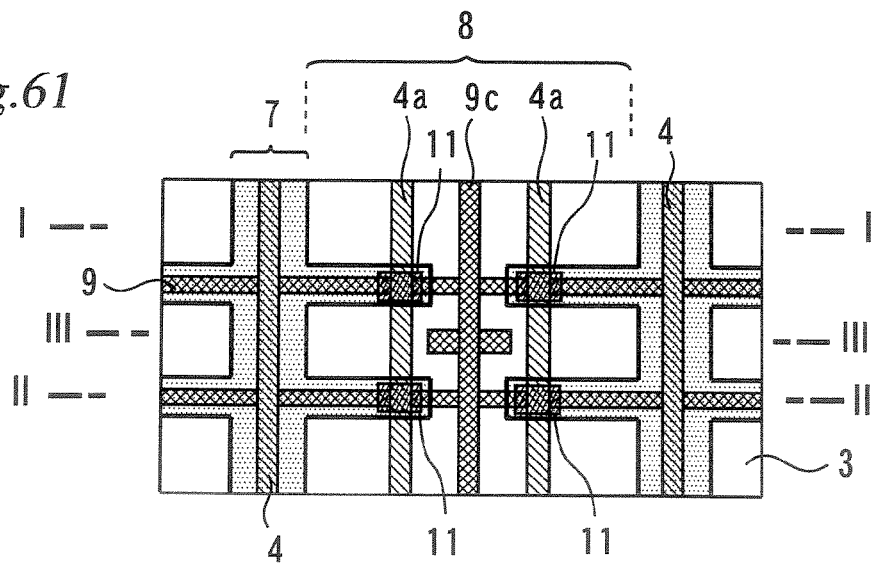
FIG. 61 is a plan view of an insulated gate semiconductor device according to the fourth variation in the fourth embodiment.
Figure 62:
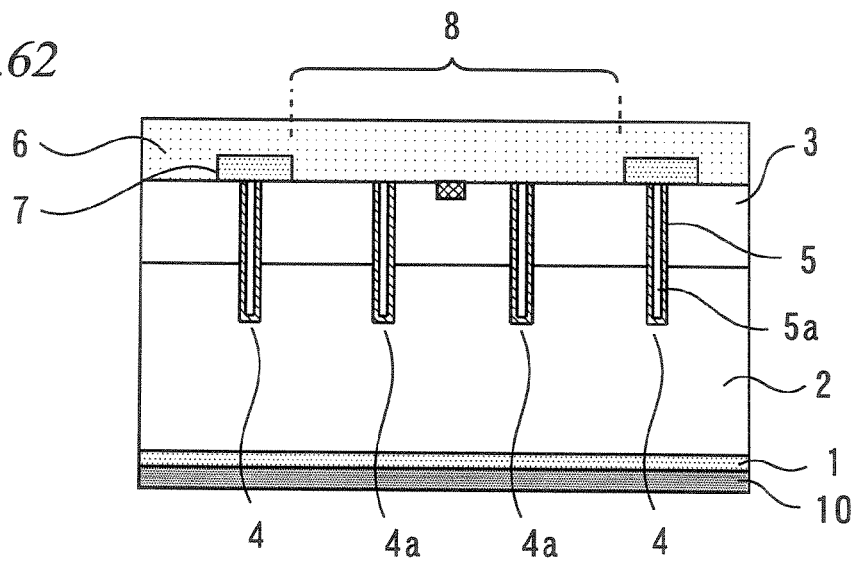
FIGS. 62, 63 and 64 are cross-sectional views of an insulated gate semiconductor device according to the fourth variation in the fourth embodiment.
Figure 63:
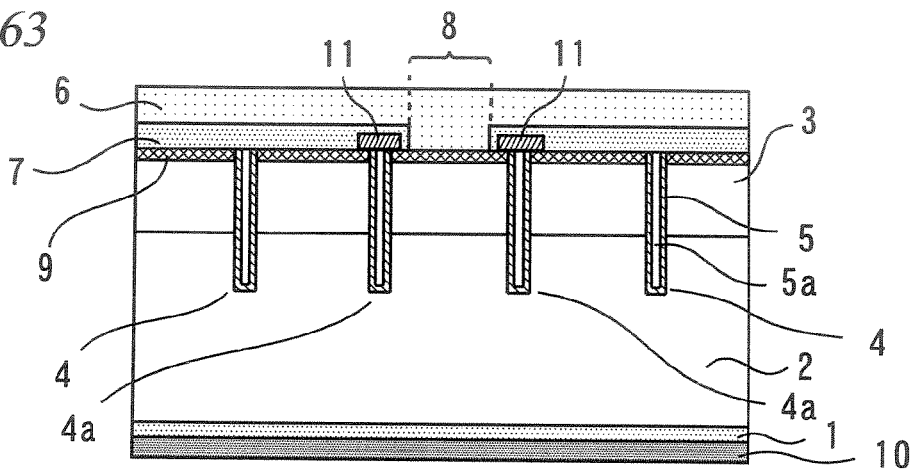
Figure 64:
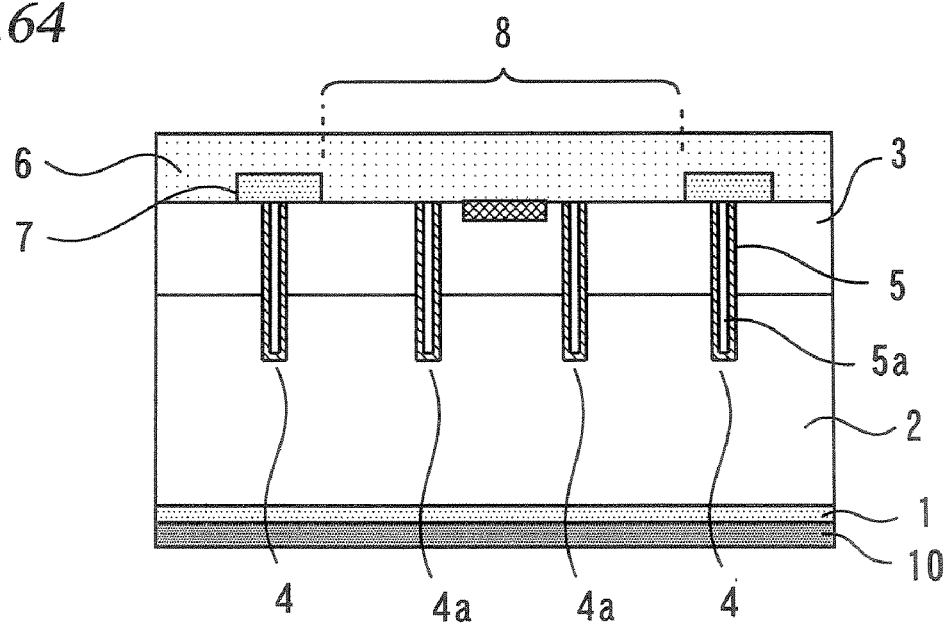

A fourth variation of the fourth embodiment will be described with reference to FIGS. 61 to 64. FIG. 61 is a plan view of an insulated gate semiconductor device according to this variation. FIGS. 62 to 64 are cross-sectional views taken along lines I-I, II-II, and III-III, respectively, of FIG. 61.

In the cross section shown in FIG. 63 taken along line II-II of FIG. 61, interlayer films 7 cover the top surfaces of dummy trenches 4a. Conductive film patterns 11 having a strip shape are formed in these interlayer films 7 above the semiconductor substrate 2 so as to connect between the first emitter diffusion layers 9 on both sides of the dummy trenches 4a, as shown in FIG. 63.

The above configuration provides an increase in the distance that the first emitter diffusion layers 9 on both sides of trenches 4 extend to an edge of a contact region 8, as shown in FIG. 63. This allows for an increase in the emitter ballast resistance.

Figure 65:
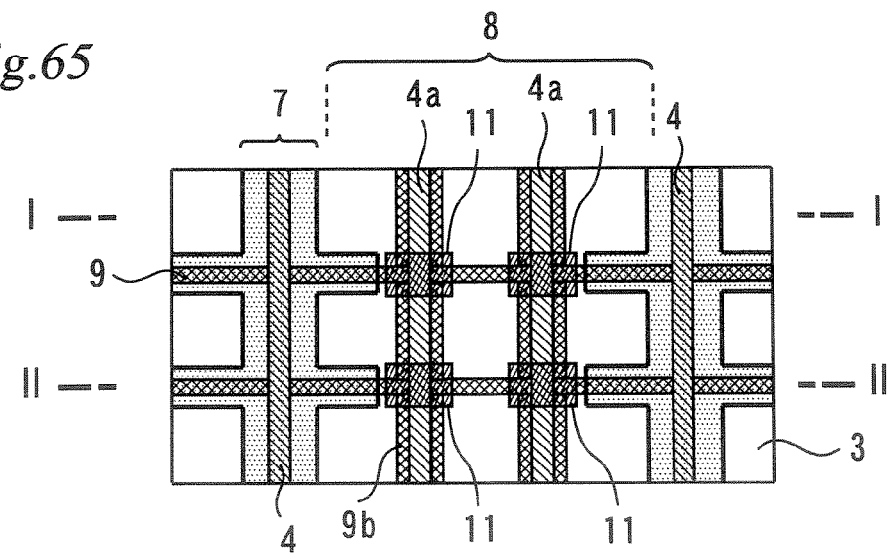
FIG. 65 is a plan view of an insulated gate semiconductor device according to the fifth variation in the fourth embodiment.
Figure 66:
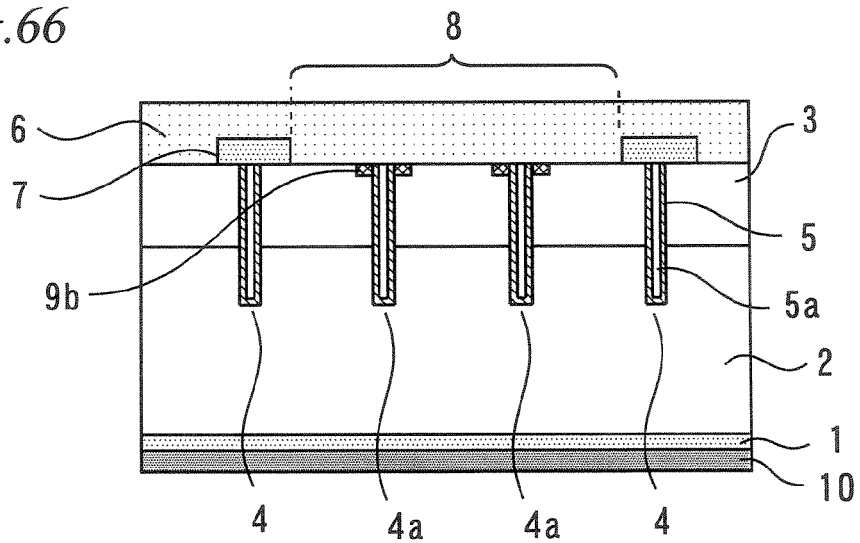
FIGS. 66 and 67 are cross-sectional views of an insulated gate semiconductor device according to the fifth variation in the fourth embodiment.
Figure 67:
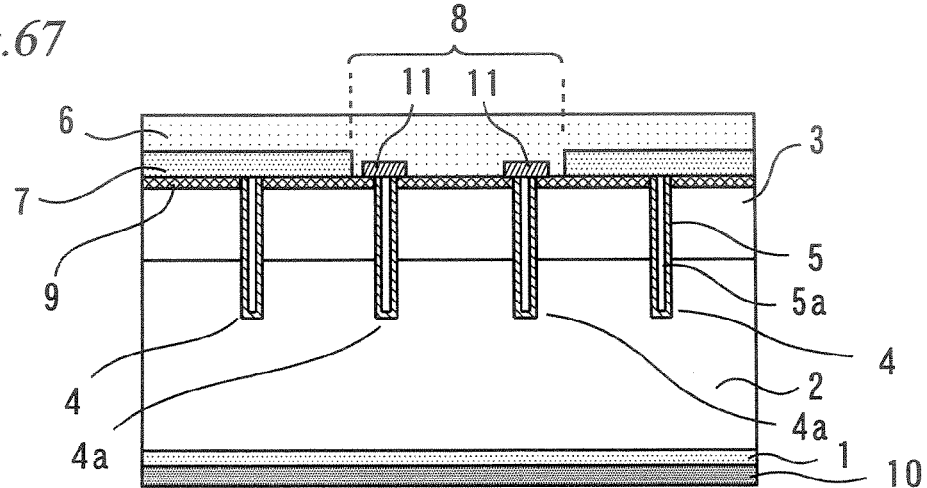

A fifth variation of the fourth embodiment will be described with reference to FIGS. 65 to 67. FIG. 65 is a plan view of an insulated gate semiconductor device according to this variation. FIGS. 66 and 67 are cross-sectional views taken along lines I-I and II-II, respectively, of FIG. 65.

Referring to FIGS. 65 and 67, conductive film patterns 11 having the same conductive type as the emitter diffusion layer region 9, are formed so as to cover the top surfaces of the dummy trenches 4a. These conductive film patterns 11 are formed of, for example, polysilicon. More specifically, the conductive film patterns 11 are formed above the semiconductor substrate 2 so as to connect between the first emitter diffusion layers 9 on both sides of each dummy trench 4a.

In this configuration, the first emitter diffusion layers 9 on both sides of each dummy trench 4a are electrically connected to each other as shown in FIG. 67, thereby increasing the contact areas between the emitter electrode 6 and these emitter diffusion layers 9. That is, the conductive film patterns 11 formed over each dummy trench 4a provide electrical connections between the emitter electrode 6 and the first emitter diffusion layers 9 on both sides of the dummy trench 4a, thereby reducing their contact resistance in the contact regions 8.

Fifth Embodiment

Figure 68:
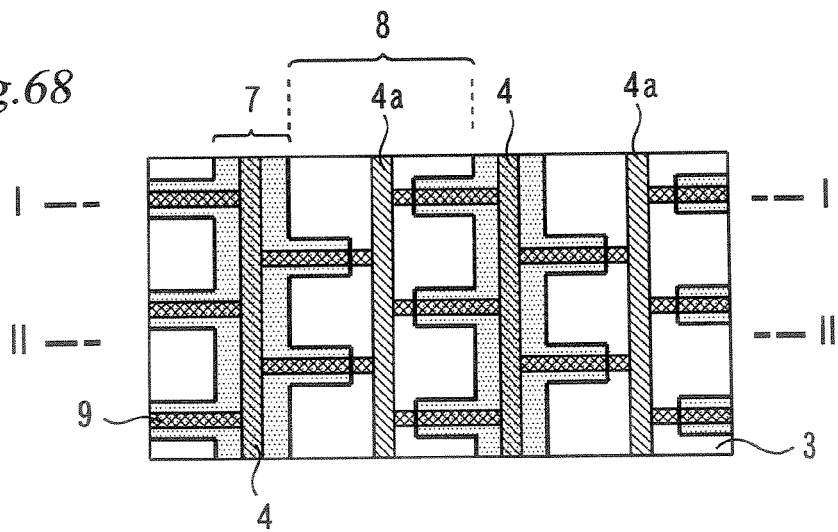
FIG. 68 is a plan view of an insulated gate semiconductor device according to the fifth embodiment.
Figure 69:
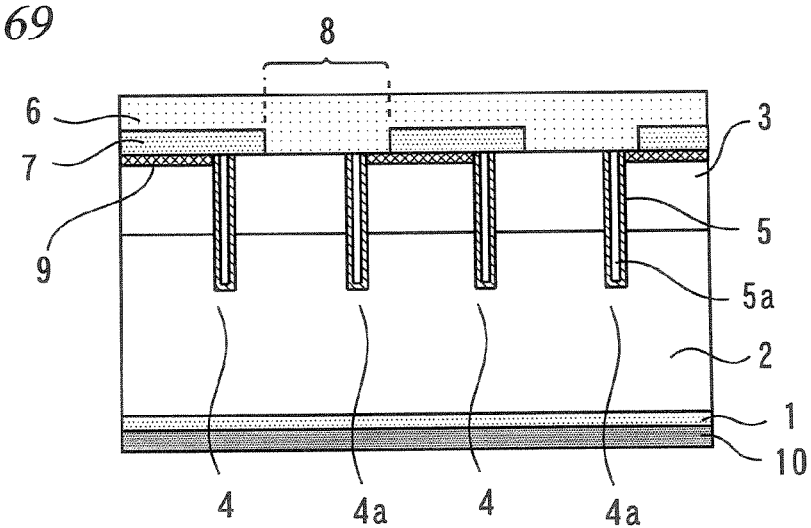
FIGS. 69 and 70 are cross-sectional views of an insulated gate semiconductor device according to the fifth embodiment.
Figure 70:
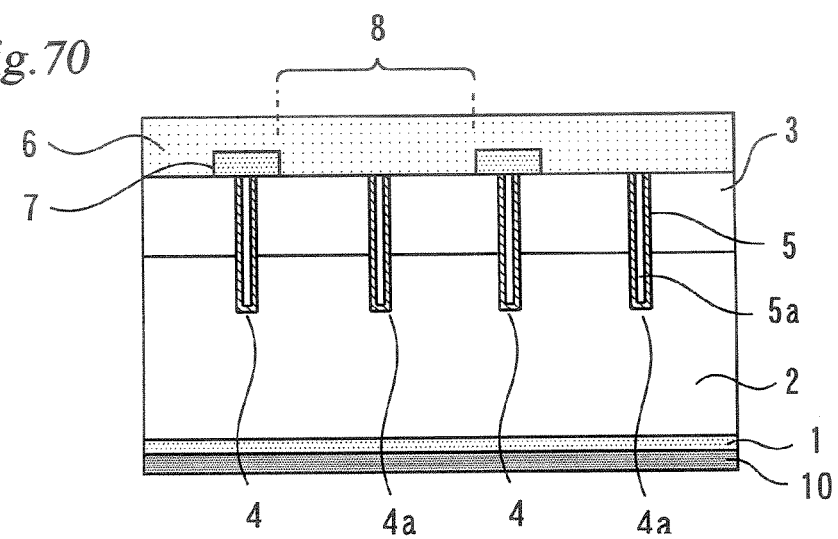

A description will now be made of an insulated gate semiconductor device according to a fifth embodiment of the present invention with reference to FIGS. 68 to 70. The following description will focus on the differences from the second embodiment. FIG. 68 is a plan view of the insulated gate semiconductor device according to this embodiment. FIGS. 69 and 70 are cross-sectional views taken along lines I-I and II-II, respectively, of FIG. 68.

Referring to FIG. 68, a plurality of trenches 4 are arranged in stripes, and a dummy trench 4a is provided between each two adjacent trenches 4. Further, a plurality of first emitter diffusion layers 9 are formed so as to extend in a direction intersecting the trenches 4 and the dummy trenches 4a.

More specifically, a plurality of first emitter diffusion layers 9 extend from each trench 4 alternately in opposite directions and are spaced from each other along the trench 4, as shown in FIG. 68. Likewise, a plurality of first emitter diffusion layers 9 extend from each dummy trench 4a alternately in opposite directions and are spaced from each other along the dummy trench 4a, as shown in FIG. 68. All other components and structures are similar to those described in connection with the second embodiment.

This configuration allows the current distribution within the semiconductor substrate 2 to be equalized. Therefore, the present embodiment can enhance the resistance to electrical breakdown, as well as achieving the same effect as the second embodiment.

It should be noted that in the configuration shown in FIGS. 1 to 3 a plurality of first emitter diffusion layers 9 may be formed so as to extend from each trench 4 alternately in opposite directions, as in the present embodiment. This also produces the effect as described above.

Therefore, the present embodiment can enhance the resistance to electrical breakdown, as well as achieving the same effect as the first and second embodiments.

Figure 71:
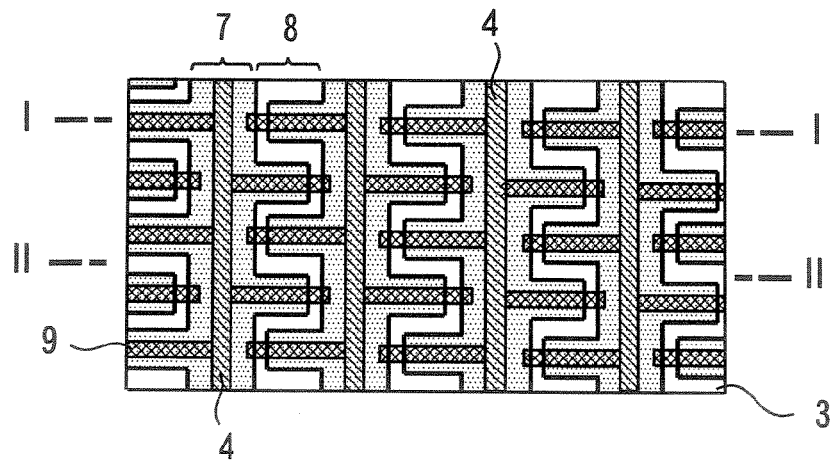
FIG. 71 is a plan view of an insulated gate semiconductor device according to the first variation in the fifth embodiment.
Figure 72:
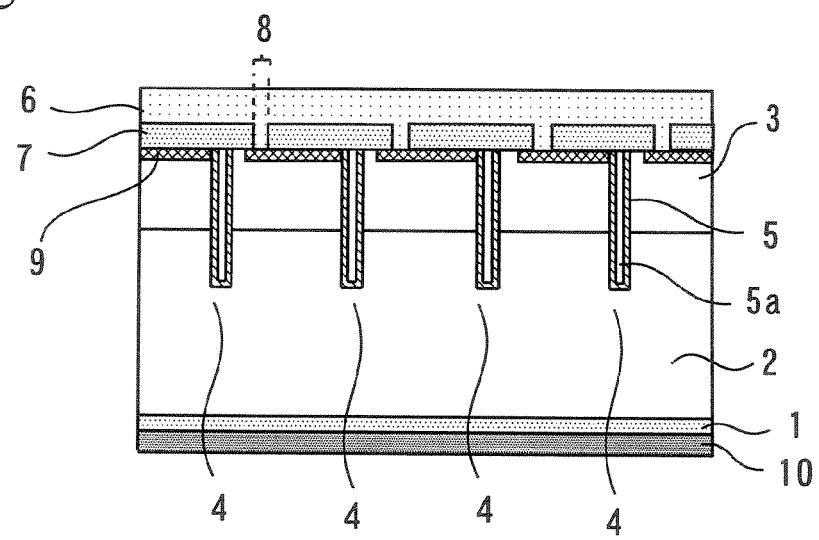
FIGS. 72 and 73 are cross-sectional views of an insulated gate semiconductor device according to the first variation in the fifth embodiment.
Figure 73:
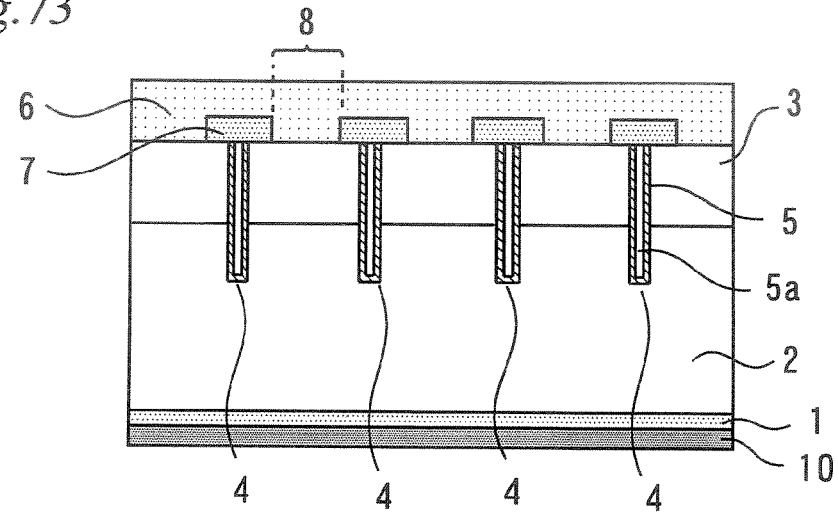

A first variation of the fifth embodiment will be described with reference to FIGS. 71 to 73. FIG. 71 is a plan view of an insulated gate semiconductor device according to this variation. FIGS. 72 and 73 are cross-sectional views taken along lines I-I and II-II, respectively, of FIG. 71.

Referring to FIGS. 71 to 73, a plurality of first emitter diffusion layers 9 extend from each trench 4 alternately in opposite directions and are spaced from each other along the trench 4, as in the above case. However, a dummy trench is not provided between adjacent trenches 4. All other components and structures are similar to those of the above insulated gate semiconductor device shown in FIGS. 68 to 70 according to the fifth embodiment. This configuration can produce the same effect as the configuration shown in FIGS. 68 to 70.

Figure 74:
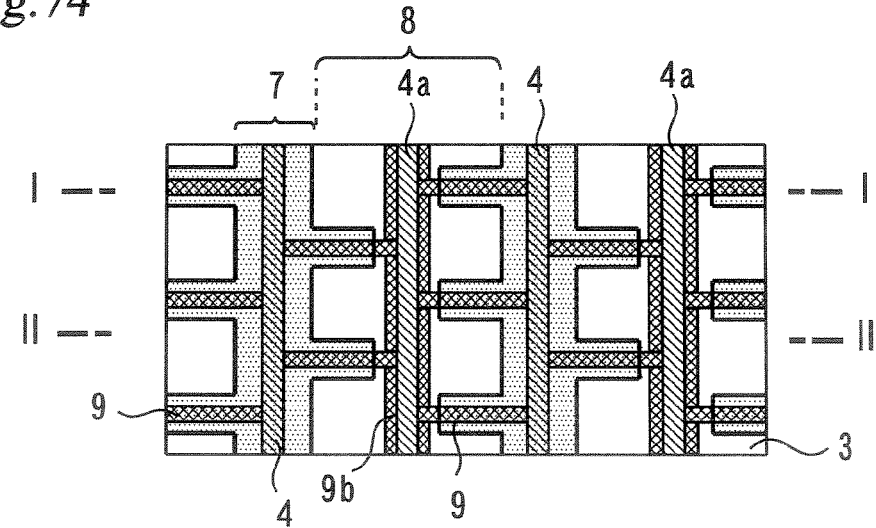
FIG. 74 is a plan view of an insulated gate semiconductor device according to the second variation in the fifth embodiment.
Figure 75:
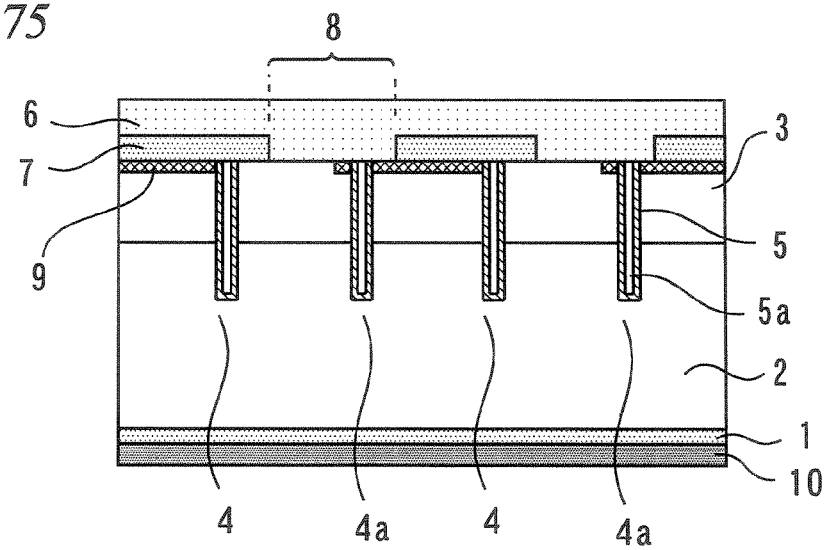
FIGS. 75 and 76 are cross-sectional views of an insulated gate semiconductor device according to the second variation in the fifth embodiment.
Figure 76:
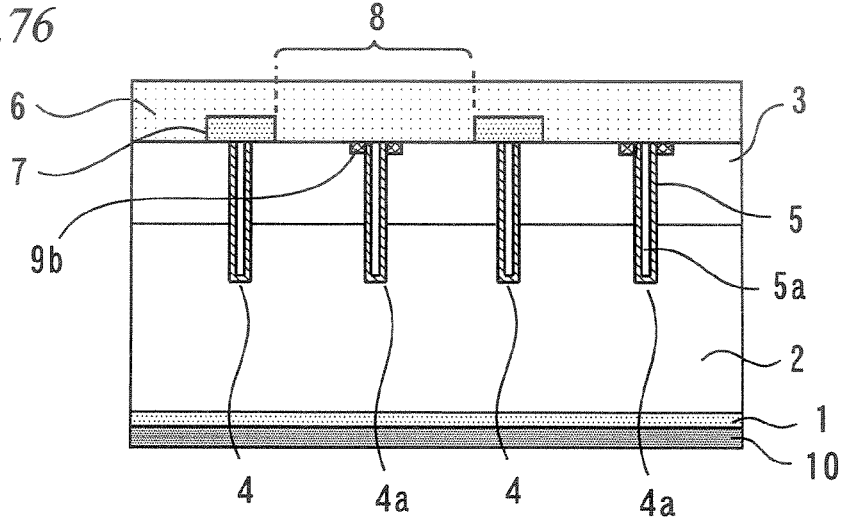

A second variation of the fifth embodiment will be described with reference to FIGS. 74 to 76. FIG. 74 is a plan view of an insulated gate semiconductor device according to this variation. FIGS. 75 and 76 are cross-sectional views taken along lines I-I and II-II, respectively, of FIG. 74.

Referring to FIGS. 74 to 76, third emitter diffusion layers 9b are provided in contact with respective sides of each dummy trench 4a. The pluralities of first emitter diffusion layers 9 and third emitter diffusion layers 9b together form a comb-shaped emitter diffusion layer. All other components and structures are similar to those of the above insulated gate semiconductor device shown in FIGS. 68 to 70 according to the fifth embodiment. This configuration also can produce the same effect as the configuration shown in FIGS. 68 to 70.

Figure 77:
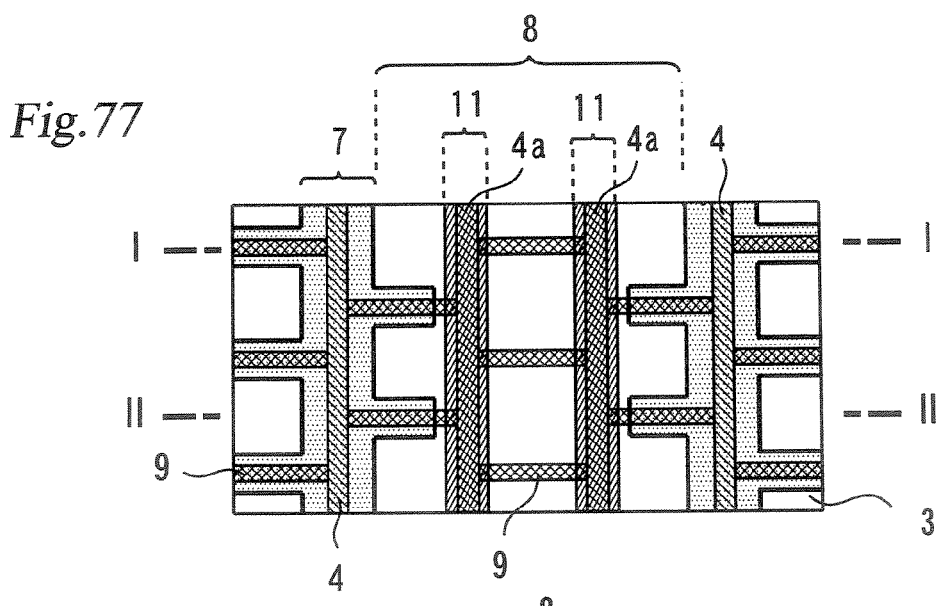
FIG. 77 is a plan view of an insulated gate semiconductor device according to the third variation in the fifth embodiment.
Figure 78:
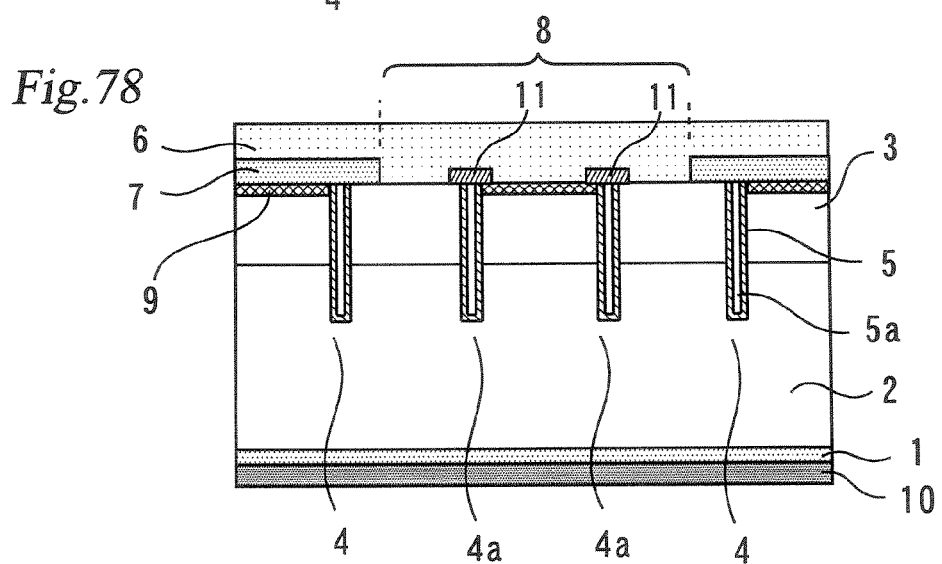
FIGS. 78 and 79 are cross-sectional views of an insulated gate semiconductor device according to the third variation in the fifth embodiment.
Figure 79:
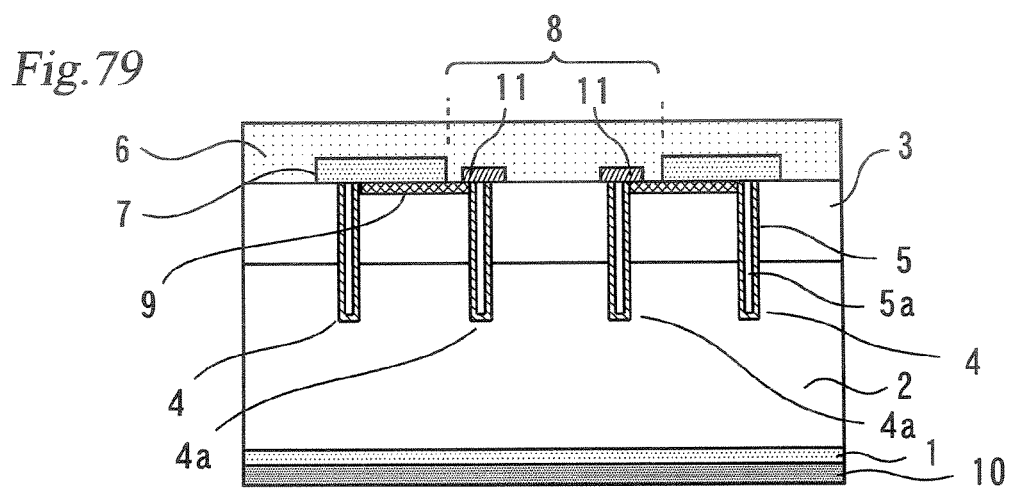

A third variation of the fifth embodiment will be described with reference to FIGS. 77 to 79. FIG. 77 is a plan view of an insulated gate semiconductor device according to this variation. FIGS. 78 and 79 are cross-sectional views taken along lines I-I and II-II, respectively, of FIG. 77.

Referring to FIGS. 77 to 79, conductive film patterns 11 having the same conductive type as the emitter diffusion layer region 9, are formed so as to cover the top surfaces of the dummy trenches 4a. These conductive film patterns 11 are formed of, for example, polysilicon. More specifically, the conductive film patterns 11 are formed above the semiconductor substrate 2 so as to connect between the first emitter diffusion layers 9 on both sides of each dummy trench 4a.

In this configuration, the first emitter diffusion layers 9 on both sides of each dummy trench 4a are electrically connected to each other, thereby increasing the contact areas between the emitter electrode 6 and these emitter diffusion layers 9. That is, the conductive film patterns 11 formed over each dummy trench 4a provide electrical connections between the emitter electrode 6 and the first emitter diffusion layers 9 on both sides of the dummy trench 4a, thereby reducing their contact resistance in the contact regions 8.

Figure 80:
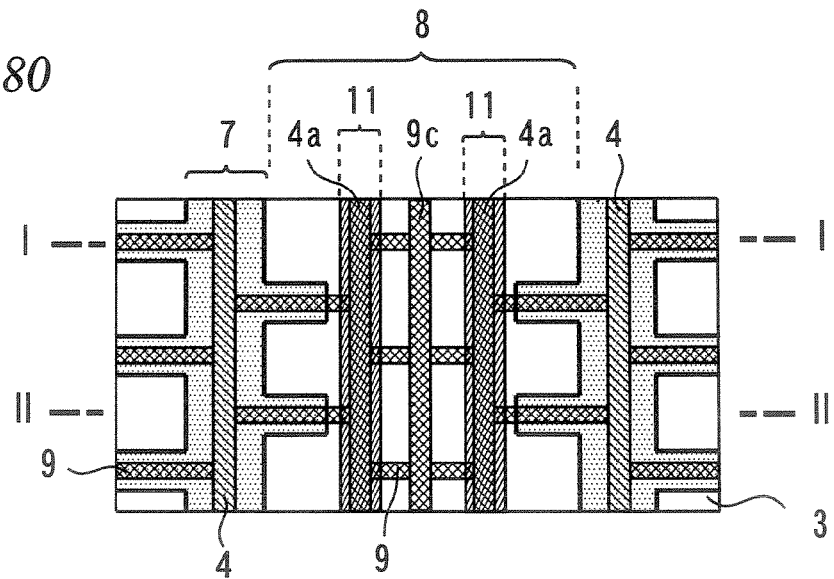
FIG. 80 is a plan view of an insulated gate semiconductor device according to the fourth variation in the fifth embodiment.
Figure 81:
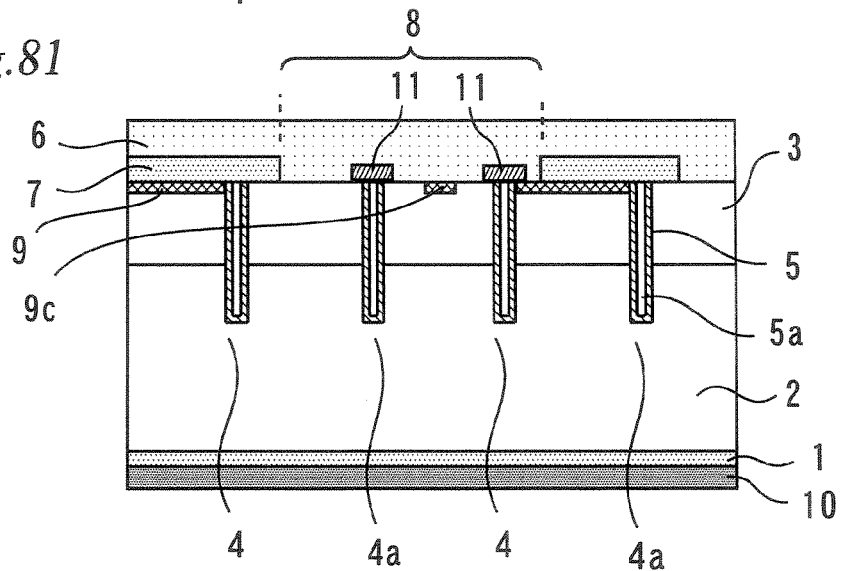
FIGS. 81 and 82 are cross-sectional views of an insulated gate semiconductor device according to the fourth variation in the fifth embodiment.
Figure 82:
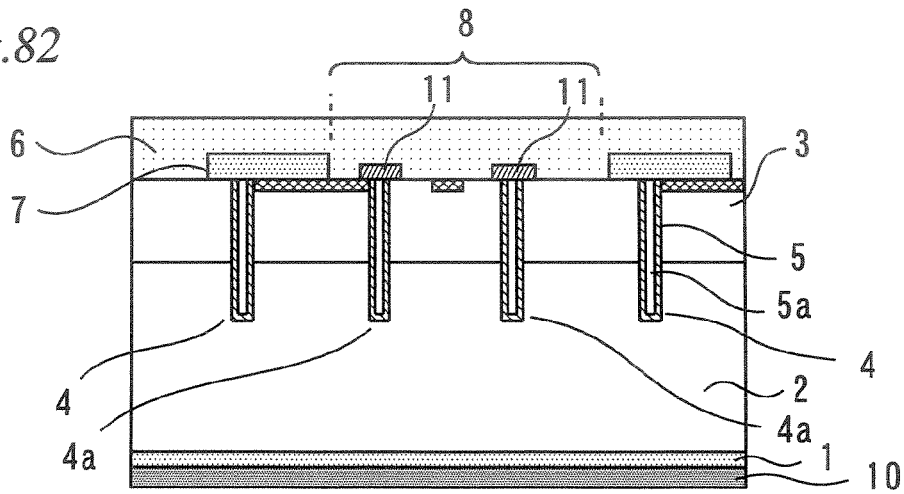

A fourth variation of the fifth embodiment will be described with reference to FIGS. 80 to 82. FIG. 80 is a plan view of an insulated gate semiconductor device according to this variation. FIGS. 81 and 82 are cross-sectional views taken along lines I-I and II-II, respectively, of FIG. 80.

Referring to FIGS. 80 to 82, conductive film patterns 11 having the same conductive type as the emitter diffusion layer region 9, are formed so as to cover the top surfaces of the dummy trenches 4a. These conductive film patterns 11 are formed of, for examples polysilicon. More specifically, the conductive film patterns 11 are formed above the semiconductor substrate 2 so as to connect between the first emitter diffusion layers 9 on both sides of each dummy trench 4a. This variation can produce the same effect as the above third variation.

It should be noted that although the first to fifth embodiments and variations thereof have been described with reference to insulated gate semiconductor devices employing an n-type semiconductor substrate, the present invention is not limited to such insulated gate semiconductor devices. The present invention can also be applied to insulated gate semiconductor devices made of a p-type semiconductor substrate and components that are opposite in conductive type to those described above.

The features and advantages of the present invention may be summarized as follows.

The present invention provides an insulated gate semiconductor device, or IGBT, that has appropriately high emitter ballast resistance to achieve transfer characteristics that allow for high resistance to electrical breakdown.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-268764, filed on Sep. 29, 2006 including specification, claims, drawings and summary, on which the Convention priority of the present application is based, are incorporated herein by reference in its entirety.

What is claimed is:

1. An insulated gate semiconductor device comprising:
a semiconductor substrate of a first conductive type having a first principal surface and a second principal surface;
a base layer of a second conductive type provided adjacent to the first principal surface of the semiconductor substrate;
a plurality of trenches formed so as to penetrate through the base layer and into the first principal surface of the semiconductor substrate, the plurality of trenches being arranged in stripes with reference to a horizontal plane that is parallel to the first principal surface of the semiconductor substrate;
insulating films covering inner surfaces of the trenches;
gate electrodes formed on the insulating films so as to fill the trenches;
a plurality of first emitter diffusion layers formed in a surface layer portion of the base layer so as to extend in a direction intersecting the trenches with reference to the horizontal plane, the plurality of first emitter diffusion layers being arranged in stripes with reference to the horizontal plane;
contact regions provided above the first principal surface of the semiconductor substrate such that the contact regions are located between adjacent ones of the trenches;
an emitter electrode formed so as to fill the contact regions, the emitter electrode being electrically connected to the first emitter diffusion layers and the base layer;
a collector layer provided on the second principal surface side of the semiconductor substrate;
a collector electrode provided on the second principal surface side of the semiconductor substrate and electrically connected to the collector layer;
a plurality of interlayer insulating films that cover the plurality of trenches, respectively, arranged in parallel next to the contact regions,
wherein the contact regions are formed above the first principal surface of the semiconductor substrate so as to extend in parallel with a longitudinal direction of the trenches with reference to the horizontal plane,
the contact regions have first portions with a first width, and second portions with a second width, the first width being smaller than the second width with reference to the horizontal plane, the first portions and the second portions are arranged alternatively next to each other in the same horizontal plane and in parallel with the longitudinal direction of the trenches, the first portions located on the first emitter diffusion layers, the second portions located on the base layer other than the first emitter diffusion layers,
the interlayer insulating films have protrusions adjacent to the first portions of the contact regions,
the protrusions are on the first emitter diffusion layers and protrude out from the interlayer insulating films in a direction that is parallel with a longitudinal direction of the first emitter diffusion layers with reference to the horizontal plane and that intersects the longitudinal direction of the trenches with reference to the horizontal plane, and each protrusion covers a single first emitter diffusion layer of the plurality of first emitter diffusion layers.

2. The insulated gate semiconductor device according to claim 1, wherein:
the sheet resistance of the first emitter diffusion layers is 100 Ω/□ or more; and
the following equation is satisfied:

$$L1 \geq 0.5 \times L2,$$

where: L1 denotes the distance between each trench and a lower edge of each contact region adjacent thereto on the first emitter diffusion layers; and L2 denotes the width of the first emitter diffusion layers in the longitudinal direction of the trenches with reference to the horizontal plane.

3. The insulated gate semiconductor device according to claim 1, further comprising:
at least one dummy trench formed between adjacent ones of the trenches so as to extend in the longitudinal direction of the trenches, the at least one dummy trench being electrically connected to the emitter electrode.

4. The insulated gate semiconductor device according to claim 3, wherein the first emitter diffusion layers include:
a plurality of first emitter diffusion layers that extend from each trench alternately in opposite directions and that are spaced from each other along the trench; and
a plurality of first emitter diffusion layers that extend from each dummy trench alternately in opposite directions and that are spaced from each other along the dummy trench.

5. The insulated gate semiconductor device according to claim 3, further comprising:
a conductive film pattern provided above the semiconductor substrate so as to connect between the first emitter diffusion layers on both sides of the at least one dummy trench.

6. The insulated gate semiconductor device according to claim 1, further comprising:
a plurality of second emitter diffusion layers having a strip shape and disposed in contact with respective sides of the trenches and extending in parallel with the longitudinal direction of the trenches with reference to the horizontal plane;
wherein the first emitter diffusion layers and the second emitter diffusion layers together form a lattice-shaped emitter diffusion layer with reference to the horizontal plane.

7. The insulated gate semiconductor device according to claim 1, further comprising:
a plurality of second emitter diffusion layers having a strip shape and disposed in contact with respective sides of the trenches;
wherein the first emitter diffusion layers and the second emitter diffusion layers together form T-shaped emitter diffusion layers.

8. The insulated gate semiconductor device according to claim 7, wherein the width of the T-shaped emitter diffusion layers in the longitudinal direction of the trenches is smaller than the distance between each trench and a lower edge of each contact region adjacent thereto on the T-shaped emitter diffusion layers.

9. The insulated gate semiconductor device according to claim 3, further comprising:
a plurality of third emitter diffusion layers having a strip shape and disposed in contact with respective sides of the at least one dummy trench;
wherein the first emitter diffusion layers and the third emitter diffusion layers together form a comb-shaped emitter diffusion layer.

10. The insulated gate semiconductor device according to claim 9, wherein the first emitter diffusion layers include:
a plurality of first emitter diffusion layers that extend from each trench alternately in opposite directions and that are spaced from each other along the trench; and
a plurality of first emitter diffusion layers that extend from each dummy trench alternately in opposite directions and that are spaced from each other along the dummy trench.

11. The insulated gate semiconductor device according to claim 3, further comprising:
a plurality of the dummy trenches; and
a fourth emitter diffusion layer provided between adjacent ones of the dummy trenches.

12. The insulated gate semiconductor device according to claim 11, wherein the first emitter diffusion layers include:
a plurality of first emitter diffusion layers that extend from each trench alternately in opposite directions and that are spaced from each other along the trench; and
a plurality of first emitter diffusion layers that extend from each dummy trench alternately in opposite directions and that are spaced from each other along the dummy trench.

13. The insulated gate semiconductor device according to claim 1, wherein the first emitter diffusion layers extend from each trench alternately in opposite directions and are spaced from each other along the trench.

14. The insulated gate semiconductor device according to claim 1,
wherein the protrusions are wider than a width of the first emitter diffusion layers measured in the longitudinal direction of the trenches with reference to the horizontal plane.

15. The insulated gate semiconductor device according to claim 1, wherein the first and second widths of the first and second portions, respectively, are extending in parallel to longitudinal extension of the first emitter diffusion layers.

16. The insulated gate semiconductor device according to claim 1, further comprising:
a plurality of second emitter diffusion layers extending in parallel with the longitudinal direction of the trenches with reference to the horizontal plane,
wherein the first emitter diffusion layers extend in a longitudinal direction that intersects a longitudinal direction of the second emitter diffusion layers in the horizontal plane.

17. The insulated gate semiconductor device according to claim 1, wherein each of the plurality of interlayer insulating films covers a portion of each of the first emitter diffusion layers.

18. The insulated gate semiconductor device according to claim 1, wherein each of the plurality of interlayer insulating films has a protrusion of the protrusions.

* * * * *